(12) United States Patent
Kato

(10) Patent No.: US 8,542,034 B2
(45) Date of Patent: Sep. 24, 2013

(54) SEMICONDUCTOR DEVICE

(75) Inventor: Kiyoshi Kato, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/472,979

(22) Filed: May 16, 2012

(65) Prior Publication Data
US 2012/0293242 A1 Nov. 22, 2012

(30) Foreign Application Priority Data

May 20, 2011 (JP) ................................ 2011-113734

(51) Int. Cl.
*H03K 19/173* (2006.01)
*H01L 25/00* (2006.01)

(52) U.S. Cl.
USPC ............................... 326/104; 326/49; 326/83

(58) Field of Classification Search
USPC .................. 326/102, 82, 83, 36, 35, 11, 112, 326/119, 104, 38, 49; 327/109, 111, 409, 327/530
See application file for complete search history.

(56) References Cited

U.S. PATENT DOCUMENTS

| | | | |
|---|---|---|---|
| 4,870,302 A | 9/1989 | Freeman | |
| 5,568,062 A | 10/1996 | Kaplinsky | |
| 5,731,856 A | 3/1998 | Kim et al. | |
| 5,744,864 A | 4/1998 | Cillessen et al. | |
| 5,982,197 A | 11/1999 | Ono et al. | |
| 6,294,274 B1 | 9/2001 | Kawazoe et al. | |
| 6,424,510 B1 * | 7/2002 | Ajit et al. | 361/59 |
| 6,563,174 B2 | 5/2003 | Kawasaki et al. | |
| 6,684,298 B1 | 1/2004 | Dwarkadas et al. | |
| 6,727,522 B1 | 4/2004 | Kawasaki et al. | |
| 6,812,787 B2 * | 11/2004 | Kimura | 330/69 |
| 7,049,190 B2 | 5/2006 | Takeda et al. | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Daniel D Chang
(74) *Attorney, Agent, or Firm* — Husch Blackwell LLP

(57) ABSTRACT

As semiconductor devices including semiconductors, logic circuits are given. Logic circuits include dynamic logic circuits and static logic circuits and are formed using transistors and the like. Dynamic logic circuits can store data for a certain period of time. Thus, leakage current from transistors causes more severe problems in dynamic logic circuits than in static logic circuits. A logic circuit includes a first transistor whose off-state current is small and a second transistor whose gate is electrically connected to the first transistor. Electric charge is supplied to a node of the gate of the second transistor through the first transistor. Electric charge is supplied to the node through a first capacitor and a second capacitor. On/off of the second transistor is controlled depending on a state of the electric charge. The first transistor includes an oxide semiconductor in a channel formation region.

30 Claims, 25 Drawing Sheets

(56) References Cited

U.S. PATENT DOCUMENTS

| | | |
|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,257,678 B2 | 8/2007 | Golden et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,818,502 B2 | 10/2010 | Kurokawa |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0184340 A1 | 9/2004 | Dwarkadas et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0091871 A1* | 4/2009 | Hung ............................ 361/56 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0293208 A1 | 11/2012 | Kato |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 6-244714 | 9/1994 |
| JP | 08-264794 A | 10/1996 |
| JP | 8-274342 | 10/1996 |
| JP | 10-22816 | 1/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-320566 | 11/2004 |
| JP | 2008-515095 | 5/2008 |
| JP | 2010-87911 | 4/2010 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350°C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 in. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OOLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] At Temperatures Over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Kimura, H. et al, "Ferroelectric-Based Functional Pass-Gate for Low-Power VLSI," Symposium on VLSI Circuits Digest of Technical Papers, 2002, pp. 196-199.

\* cited by examiner

● In
☾ Sn
☽ Zn
● O

In
Ga
Zn
O

- In
- Ga or Zn
- O

- In
- Ga
- Zn
- O

SEMICONDUCTOR DEVICE

BACKGROUND OF THE INVENTION

1. Field of the Invention

The present invention relates to a semiconductor device including a semiconductor.

2. Description of the Related Art

As semiconductor devices including semiconductors, logic circuits are given. Logic circuits include dynamic logic circuits and static logic circuits and are formed using transistors and the like. Dynamic logic circuits can store data for a certain period of time. Thus, leakage current from transistors causes more severe problems in dynamic logic circuits than in static logic circuits. Leakage current is attributed to off-state current flowing when transistors are turned off.

For example, in a dynamic circuit, leakage current is high when a MOS transistor which controls supply of electric charge to a dynamic node is off, which is regarded as a problem. To solve this problem, a structure has been suggested in which a MOS transistor circuit is inserted into a current path to a dynamic node (Patent Document 1).

Further, another structure is suggested in which a leakage current detecting circuit that detects current corresponding to leakage current and, in addition, a leakage current correcting circuit that operates in correcting leakage current are provided in a dynamic circuit (Patent Document 2).

Furthermore, added functions of logic circuits have been under consideration. For example, a reconfigurable logic circuit which can have a property of being dynamically reconfigurable (also referred to as a property of a dynamic reconfiguration) can be given. Suggested is a structure in which such a logic circuit includes a switching portion for switching between OR/AND and NOR/NAND/NOT (Patent Document 3).

The off-state current of a thin film transistor is $10^{-13}$ A to $10^{-14}$ A when Vgs is 0 V or lower (Patent Document 4).

REFERENCE

[Patent Document 1] Japanese Published Patent Application No. H6-244714
[Patent Document 2] Japanese Published Patent Application No. H10-022816
[Patent Document 3] Japanese Published Patent Application No. 2010-087911
[Patent Document 4] Japanese Published Patent Application No. H8-274342

SUMMARY OF THE INVENTION

An object of one embodiment of the present invention is to solve a problem of leakage current in a logic circuit.

Another object of one embodiment of the present invention is to make a logic circuit have a property of being dynamically reconfigurable.

In view of the above objects, provided is a logic circuit including at least a transistor whose off-state current is lower than that of a transistor included in an LSI.

It is possible to provide a logic circuit including such a transistor whose off-state current is low and thus having a property of being dynamically reconfigurable.

Provision of a transistor whose off-state current is low makes it possible to solve a problem of leakage current.

Provision of a transistor whose off-state current is low allows provision of a dynamically reconfigurable logic circuit.

A logic circuit according to one embodiment of the present invention has a circuit configuration simpler than a conventional circuit configuration.

DETAILED DESCRIPTION OF THE INVENTION

Hereinafter, embodiments will be described with reference to the accompanying drawings. However, the embodiments can be implemented in various modes. It will be readily appreciated by those skilled in the art that the modes and details can be changed in various ways without departing from the spirit and scope of the present invention. Therefore, one embodiment of the present invention should not be construed as being limited to the following descriptions of the embodiments.

Embodiment 1

Figure 1:
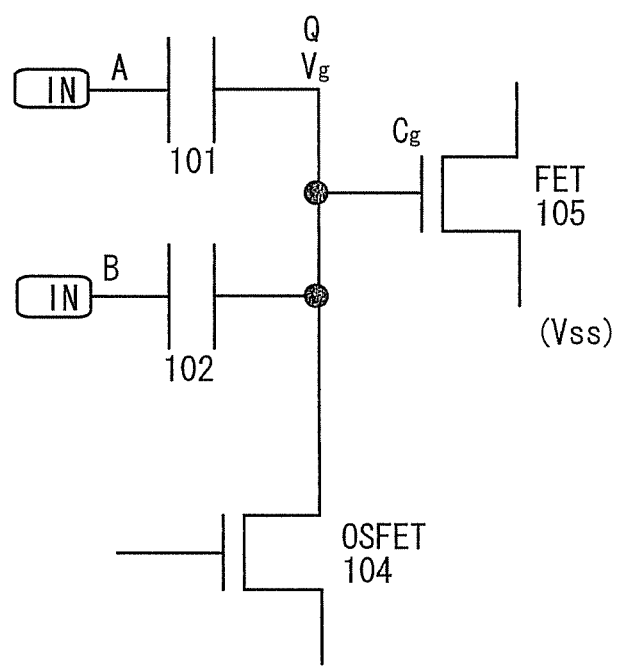
FIG. 1 is a circuit diagram of a logic circuit according to one embodiment of the present invention.

In this embodiment, a basic structure of a logic circuit will be described. FIG. 1 illustrates a logic circuit including a first capacitor 101, a second capacitor 102, a first transistor (OS-FET) 104 whose off-state current is low, and a second transistor (FET) 105.

The first transistor is also referred to as an OSFET because it includes an oxide semiconductor in a channel formation region. A channel formation region including an oxide semiconductor has n-type conductivity in many cases; thus, the first transistor is an n-channel transistor. The off-state current of such a transistor including an oxide semiconductor in a channel formation region is low. The details of the transistor will be described in the following embodiment.

A transistor including silicon in a channel formation region is used as the second transistor since the off state-current of the second transistor is not necessarily as low as that of the first transistor. Such a transistor is referred to as an FET. A description will be given of the case where the second transistor has the same conductivity type as the first transistor, i.e., the case where the second transistor is an n-channel transistor.

The first capacitor 101, the second capacitor 102, the first transistor 104, and the second transistor 105 are electrically connected to one another as illustrated in FIG. 1. One electrode of the first capacitor 101 is electrically connected to a gate of the second transistor 105. One electrode of the second capacitor 102 is electrically connected to the gate of the second transistor 105. The one electrode of the second capacitor 102 is also electrically connected to one of a source and a drain of the first transistor 104. Since the first transistor 104 is an n-channel transistor, the drain of the first transistor 104 is electrically connected to the one electrode of the second capacitor 102.

Signals are input from a terminal A and a terminal B. In other words, signals are input from the other electrode of the first capacitor 101 and the other electrode of the second capacitor 102. Each of these signals has any of the following potentials: high potentials (also referred to as High, H, Vdd, and 1) and low potentials (also referred to as Low, L, Vss, and 0). A high potential and a low potential are relative. A low potential is not limited to 0 V.

On state or off state (also referred to as On/off or a switching function) of the first transistor 104 is controlled by a signal input to a gate thereof. On/off of the second transistor 105 is controlled by a signal input to the gate thereof.

As illustrated in FIG. 1, the capacitance value of each of the first capacitor 101 and the second capacitor 102 is denoted as C, electric charge of a node electrically connected to the one electrode of the first capacitor 101 is denoted as Q, the voltage of the node is denoted as Vg, and the gate capacitance of the second transistor 105 is denoted as Cg. The voltage Vg of the node is expressed in Formula 1. Assume that the source-drain voltage of the second transistor 105 is 0 V, for the sake of simplicity.

$$Vg = \frac{C}{2C+Cg}(VA+VB) + \frac{Q}{2C+Cg} \quad \text{[FORMULA 1]}$$

In Formula 1, the value of Q/(2C+Cg) depends on the value of Q. In other words, the value of Q/(2C+Cg) varies depending on a signal input through the first transistor 104. This is because the electric charge Q depends on a signal input through the first transistor 104. Since the off-state current of the first transistor 104 is significantly low, the value of Q input can be held. Unlike in a conventional technique, the value of Q input can be held without another element.

For example, assume that Q is 0, and the threshold voltage Vth of the second transistor 105 is a positive small value. The first transistor 104 is turned on and the voltage Vg at which Q is 0 is input (also referred to as applied or written) through the first transistor 104. After the input (or the input operation) is completed, the first transistor 104 is turned off. The value of Q input is held. Assume that high-level signals are input to the terminal A and the terminal B. These signals are denoted as (1,1). At this time, VA=VB=Vdd is satisfied as a potential VA of the terminal A and a potential VB of the terminal B, and Vg is expressed in Formula 2.

$$Vg = \left\{\frac{1}{1+\frac{Cg}{2C}}\right\} Vdd \quad \text{[FORMULA 2]}$$

At this time, Vg>Vth (105) is satisfied; thus, the second transistor 105 is turned on. Here, the threshold voltage of the second transistor 105 is denoted as Vth (105).

Similarly, assume that Q is 0, and a high-level signal and a low-level signal are input to the terminal A and the terminal B, respectively. These signals are denoted as (1,0). At this time, VA=Vdd and VB=0 are satisfied, and Vg is expressed in Formula 3.

$$Vg = \left\{\frac{1}{1+\frac{Cg}{2C}}\right\} \times \frac{Vdd}{2} \quad \text{[FORMULA 3]}$$

At this time, Vg>Vth is satisfied; thus, the second transistor 105 is turned on.

Similarly, assume that Q is 0, and a low-level signal and a high-level signal are input to the terminal A and the terminal B, respectively. These signals are denoted as (0,1). At this time, VA=0 and VB=Vdd are satisfied, and Vg is expressed in Formula 3.

At this time, the second transistor 105 is turned on.

Similarly, assume that Q is 0, and low-level signals are input to the terminal A and the terminal B. These signals are denoted as (0,0). At this time, VA=VB=0 is satisfied, and Vg is expressed in Formula 4.

$$Vg = \left\{\frac{1}{1+\frac{Cg}{2C}}\right\} \times 0 \quad \text{[FORMULA 4]}$$

At this time, Vg<Vth is satisfied; thus, the second transistor 105 is turned off.

The above operations are shown in Table 1.

TABLE 1

| Q = 0 | | |
|---|---|---|
| A | B | FET105 |
| 1 | 1 | ON |
| 0 | 1 | ON |
| 1 | 0 | ON |
| 0 | 0 | OFF |

Only when low-level signals are input to the terminal A and the terminal B, the second transistor 105 is turned off, and in the other cases, the second transistor 105 is turned on. The condition under which the second transistor 105 is turned on varies depending on a signal input through the first transistor 104. That is, the on/off state (or a switching function) of the second transistor 105 depends on the value of Q.

Next, the value of Q is changed. Since the second transistor 105 is an n-channel transistor, Q is smaller than 0 (negative).

The first transistor 104 is turned on and a signal with which Q is smaller than 0 is input through the first transistor 104. After the input is completed, the first transistor 104 is turned off. The value of Q input is held. Assume that high-level signals are input to the terminal A and the terminal B. These signals are denoted as (1,1). At this time, VA=VB=Vdd is satisfied, and Vg is expressed in Formula 2. At this time, the value of Q is changed appropriately so that Q is smaller than 0, whereby the second transistor 105 can be turned on.

Assume that Q is a similar value (Q<0), and a high-level signal and a low-level signal (1,0) are input to the terminal A and the terminal B, respectively. At this time, Q is varied appropriately, whereby the second transistor 105 can be turned off.

Assume that Q is a similar value (Q<0), and a low-level signal and a high-level signal (0, 1) are input to the terminal A and the terminal B, respectively. At this time, Q is changed appropriately, whereby the second transistor 105 can be turned off.

Assume that Q is a similar value (Q<0), and low-level signals (0,0) are input to the terminal A and the terminal B. At this time, Q is changed appropriately, whereby the second transistor 105 can be turned off.

The above operations are shown in Table 2.

TABLE 2

| Q < 0 | | |
|---|---|---|
| A | B | FET105 |
| 1 | 1 | ON |
| 0 | 1 | OFF |
| 1 | 0 | OFF |
| 0 | 0 | OFF |

Only when high-level signals are input to the terminal A and the terminal B, the second transistor 105 is turned on, and in the other cases, the second transistor 105 is turned off. The condition under which the second transistor 105 is turned on varies depending on a signal input through the first transistor 104. That is, the on/off state of the second transistor 105 depends on the value of Q.

Figure 2:
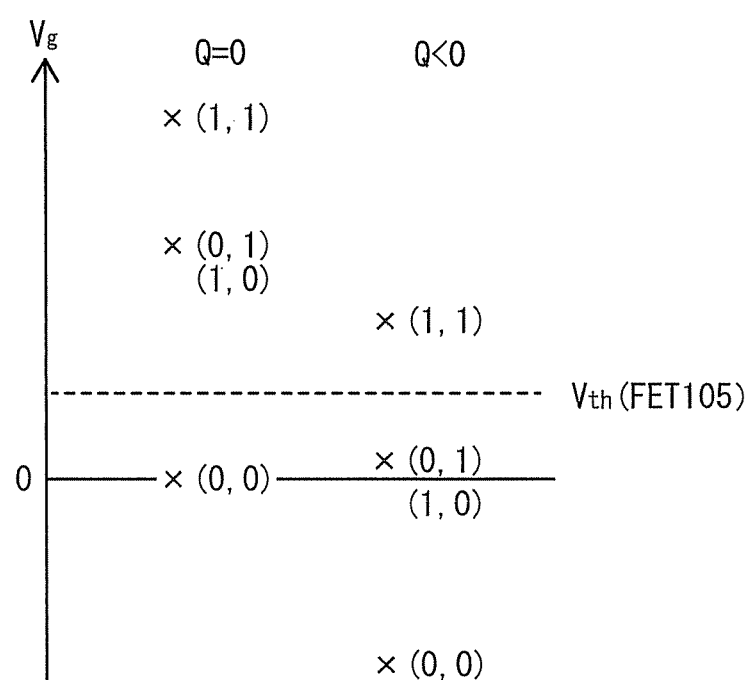
FIG. 2 is a schematic diagram showing dynamic reconfiguration of a logic circuit according to one embodiment of the present invention.

FIG. 2 shows the relation between Table 1 and Table 2. In the logic circuit according to one embodiment of the present invention, a change-over switch or the like is not provided and the on/off state of the second transistor 105 is determined depending on the value of Q (Q=0 or Q<0). Thus, the logic circuit can be dynamically reconfigurable. This is because the off-state current of the first transistor 104 is so low that each of the state where Q is 0 and the state where Q is smaller than 0 can be retained.

Generalized operations will be described. The threshold voltage of the second transistor 105 is denoted as Vth. According to Formula 1, it is found that Vg is a function of the terminal A, the terminal B, and Q. Assume that the gate potential of the second transistor 105 at the time when high-level signals are input to the terminal A and the terminal B is Vg (A=1, B=1, Q), the gate potential of the second transistor 105 at the time when a low-level signal and a high-level signal are input to the terminal A and the terminal B, respectively, is Vg (A=0, B=1, Q), the gate potential of the second transistor 105 at the time when a high-level signal and a low-level signal are input to the terminal A and the terminal B, respectively, is Vg (A=1, B=0, Q), and the gate potential of the second transistor 105 at the time when low-level signals are input to the terminal A and the terminal B is Vg (A=0, B=0, Q).

When high-level signals are input to the terminal A and the terminal B, Vg is expressed in Formula 5.

$$Vg(A=1, B=1, Q) = \frac{Vdd}{1+\frac{Cg}{2C}} + \frac{Q}{2C+Cg} \quad \text{[FORMULA 5]}$$

When a low-level signal and a high-level signal are input to the terminal A and the terminal B, respectively, Vg is expressed in Formula 6.

$$Vg(A=0, B=1, Q) = \frac{Vdd}{2\left(1+\frac{Cg}{2C}\right)} + \frac{Q}{2C+Cg} \quad \text{[FORMULA 6]}$$

When a high-level signal and a low-level signal are input to the terminal A and the terminal B, respectively, Vg is expressed in Formula 7.

$$Vg(A=1, B=0, Q) = \frac{Vdd}{2\left(1+\frac{Cg}{2C}\right)} + \frac{Q}{2C+Cg} \quad \text{[FORMULA 7]}$$

When low-level signals are input to the terminal A and the terminal B, Vg is expressed in Formula 8.

$$Vg(A=0, B=0, Q) = \frac{Q}{2C+Cg} \quad \text{[FORMULA 8]}$$

Formula 9 is derived from Formulae 5 to 8.

$$Vg(A=1,B=1,Q) > Vg(A=0,B=1,Q) = Vg(A=1,B=0,Q) > Vg(A=0,B=0,Q) \quad \text{[FORMULA 9]}$$

Assuming that electric charge applied through the first transistor 104 is $Q_0$, it is found that the relation of Table 1 is met when $Q_0$ satisfies Formula 10.

$$Vg(A=1,B=0,Q=Q0) > Vth > Vg(A=0,B=0,Q=Q0) \quad \text{[FORMULA 10]}$$

Specifically, assuming that a potential supplied (while A is 0 and B is 0) is $Vg_0$, $Vg_0$ satisfies Formula 11.

$$Vth - \frac{Vdd}{2 + \frac{Cg}{C}} < Vgo < Vth \quad \text{[FORMULA 11]}$$

Assuming that electric charge applied through the first transistor 104 is $Q_1$, it is found that the relation of Table 2 is met when $Q_1$ satisfies Formula 12.

$$Vg(A=1,B=1,Q=Q1) > Vth > Vg(A=1,B=0,Q=Q1) \quad \text{[FORMULA 12]}$$

Specifically, assuming that a potential supplied (while A is 0 and B is 0) is $Vg_1$, $Vg_1$ satisfies Formula 13.

$$Vth - \frac{Vdd}{2 + \frac{Cg}{C}} < Vgo < Vth \quad \text{[FORMULA 13]}$$

When a transistor including an oxide semiconductor in a channel formation region is used as the first transistor 104, the logic circuit can have both a function of performing logic operation and a function of storing data.

According to one embodiment of the present invention, since dynamic reconfiguration can be performed when a transistor (OSFET) is turned on, a pulse may be applied to a gate of the transistor. Thus, the state of the transistor can be determined in a short time.

The dynamic reconfiguration according to one embodiment of the present invention is not adversely affected by an input signal because the function can be controlled independently of an input signal.

According to one embodiment of the present invention, a problem of leakage current can be solved.

According to one embodiment of the present invention, dynamic reconfiguration can be performed.

According to one embodiment of the present invention, the circuit configuration is simpler than a conventional circuit configuration.

Embodiment 2

Figure 3:
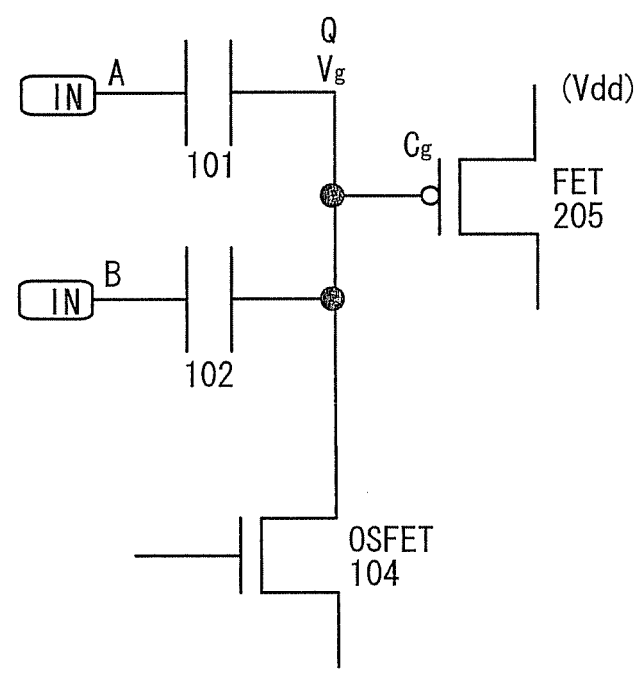
FIG. 3 is a circuit diagram of a logic circuit according to one embodiment of the present invention.

In this embodiment, a basic structure of a logic circuit in which the second transistor described in Embodiment 1 is a p-channel transistor will be described. FIG. 3 illustrates a logic circuit including the first capacitor 101, the second capacitor 102, the first transistor (OSFET) 104 whose off-state current is low, and a second transistor (FET) 205. The second transistor is a p-channel transistor.

The first capacitor 101, the second capacitor 102, the first transistor 104, and the second transistor 205 are electrically connected to one another as illustrated in FIG. 3. One electrode of the first capacitor 101 is electrically connected to a gate of the second transistor 205. One electrode of the second capacitor 102 is electrically connected to the gate of the second transistor 205. The one electrode of the second capacitor 102 is also electrically connected to one of a source and a drain of the first transistor 104. Since the first transistor 104 is an n-channel transistor, the drain of the first transistor 104 is electrically connected to the one electrode of the second capacitor 102.

On state or off state (also referred to as On/off) of the first transistor 104 is controlled by a signal input to a gate thereof. On/off of the second transistor 205 is controlled by a signal input to the gate thereof. High-level signals (also referred to as High, H, Vdd, and 1) and a low-level signals (also referred to as High, H, Vdd, and 1) are input from the terminal A and the terminal B.

As illustrated in FIG. 3, the capacitance value of each of the first capacitor 101 and the second capacitor 102 is denoted as C, electric charge of a node electrically connected to the one electrode of the first capacitor 101 is denoted as Q, the voltage of the node is denoted as Vg, and the gate capacitance of the second transistor 205 is denoted as Cg. The voltage Vg of the node is expressed in Formula 14. Assume that the source-drain voltage of the second transistor 205 is Vdd, for the sake of simplicity.

$$Vg = \frac{C}{2C+Cg}(VA+VB) + \frac{Q}{2C+Cg} + \frac{Cg}{2C+Cg}Vdd \quad \text{[FORMULA 14]}$$

In Formula 14, the value of Q/(2C+Cg) depends on the value of Q. In other words, the value of Q/(2C+Cg) varies depending on a signal input through the first transistor 104. This is because the electric charge Q depends on a signal input through the first transistor 104. Since the off-state current of the first transistor 104 is significantly low, the value of Q input can be held. Unlike in a conventional technique, the value of Q input can be held without another element.

For example, assume that Q is 0, and the threshold voltage (Vth) of the second transistor 205 is a negative small value. The first transistor 104 is turned on and the voltage Vg at which Q is 0 is applied through the first transistor 104. Then, the first transistor 104 is turned off. The value of Q input is held. Assume that high-level signals (1,1) are input to the terminal A and the terminal B. The voltage Vg is expressed in Formula 15.

$$Vg = \left(1 - \frac{\frac{1}{2}}{1 + \frac{Cg}{2C}}\right)Vdd \quad \text{[FORMULA 15]}$$

At this time, Vg−Vdd>Vth (205) is satisfied; thus, the second transistor 205 is turned off. Here, the threshold voltage of the second transistor 205 is denoted as Vth (205).

Similarly, assume that Q is 0, and a high-level signal and a low-level signal (1,0) are input to the terminal A and the terminal B, respectively. The voltage Vg is expressed in Formula 16.

$$Vg = \left(1 - \frac{\frac{1}{2}}{1 + \frac{Cg}{2C}}\right)Vdd \quad \text{[FORMULA 16]}$$

At this time, Vg−Vdd<Vth (205) is satisfied; thus, the second transistor 205 is turned on.

Similarly, assume that Q is 0, and a low-level signal and a high-level signal (0,1) are input to the terminal A and the terminal B, respectively. Formula 17 expresses Vg.

$$Vg = \left(1 - \frac{1}{1 + \frac{Cg}{2C}}\right)Vdd \quad \text{[FORMULA 17]}$$

At this time, Vg−Vdd<Vth (205) is satisfied; thus, the second transistor 205 is turned on.

Similarly, assume that Q is 0, and low-level signals are input to the terminal A and the terminal B. At this time, Vg−Vdd<Vth (205) is satisfied; thus, the second transistor 205 is turned on.

The above operations are shown in Table 3.

TABLE 3

| Q = 0 | | |
|---|---|---|
| A | B | FET205 |
| 1 | 1 | OFF |
| 0 | 1 | ON |
| 1 | 0 | ON |
| 0 | 0 | ON |

Only when high-level signals are input to the terminal A and the terminal B, the second transistor (FET) 205 is turned off, and in the other cases, the second transistor (FET) 205 is turned on. The condition under which the second transistor 205 is turned on varies depending on a signal input through the first transistor 104. That is, the on/off state of the second transistor 205 depends on the value of Q.

Next, the value of Q is changed. Since the second transistor 205 is a p-channel transistor, Q is larger than 0 (positive).

The first transistor 104 is turned on and a signal with which Q is larger than 0 is input. After the input is completed, the first transistor 104 is turned off. The value of Q input is held. Assume that high-level signals (1,1) are input to the terminal A and the terminal B. At this time, the value of Q is varied appropriately so that Q is larger than 0, whereby the second transistor 205 can be turned off.

Assume that Q is a similar value (Q>0), and a high-level signal and a low-level signal (1,0) are input to the terminal A and the terminal B. At this time, Q is varied appropriately, whereby the second transistor 205 can be turned off.

Assume that Q is a similar value (Q>0), and a low-level signal and a high-level signal (0,1) are input to the terminal A and the terminal B, respectively. At this time, Q is varied appropriately, whereby the second transistor 205 can be turned off.

Assume that Q is a similar value (Q>0), and low-level signals (0,0) are input to the terminal A and the terminal B. At this time, Q is varied appropriately, whereby the second transistor 205 can be turned on.

The above operations are shown in Table 4.

TABLE 4

| Q > 0 | | |
|---|---|---|
| A | B | FET205 |
| 1 | 1 | OFF |
| 0 | 1 | OFF |
| 1 | 0 | OFF |
| 0 | 0 | ON |

Only when low-level signals are input to the terminal A and the terminal B, the second transistor (FET) 205 is turned on, and in the other cases, the second transistor (FET) 205 is turned off. The condition under which the second transistor 205 is turned on varies depending on a signal input through the first transistor 104. That is, the on/off state of the second transistor 205 depends on the value of Q.

A change-over switch is not provided and the on/off state of the second transistor 205 is determined depending on the value of Q (Q=0 or Q>0). Thus, the logic circuit can be dynamically reconfigurable. This is because the off-state current of the first transistor 104 is so low that each of the state where Q is 0 and the state where Q is larger than 0 can be retained.

Generalized operations will be described. The threshold voltage of the second transistor 205 is denoted as Vthp. According to Formula 5, it is found that Vg is a function of the terminal A, the terminal B, and Q. Assume that the gate potential of the second transistor 205 at the time when high-level signals are input to the terminal A and the terminal B is Vg (A=1, B=1, Q), the gate potential of the second transistor 205 at the time when a low-level signal and a high-level signal are input to the terminal A and the terminal B, respectively, is Vg (A=0, B=1, Q), the gate potential of the second transistor 205 at the time when a high-level signal and a low-level signal are input to the terminal A and the terminal B, respectively, is Vg (A=1, B=0, Q), and the gate potential of the second transistor 205 at the time when low-level signals are input to the terminal A and the terminal B is Vg (A=0, B=0, Q).

When high-level signals are input to the terminal A and the terminal B, Vg is expressed in Formula 18.

$$Vg(A=1, B=1, Q) = Vdd + \frac{Q}{2C + Cg} \quad [\text{FORMULA 18}]$$

When a low-level signal and a high-level signal are input to the terminal A and the terminal B, Vg is expressed in Formula 19.

$$Vg(A=0, B=1, Q) = \left\{1 - \frac{1}{2\left(1+\frac{Cg}{2C}\right)}\right\} Vdd + \frac{Q}{2C+Cg} \quad [\text{FORMULA 19}]$$

When a high-level signal and a low-level signal are input to the terminal A and the terminal B, respectively, Vg is expressed in Formula 20.

$$Vg(A=1, B=0, Q) = \left\{1 - \frac{1}{2\left(1+\frac{Cg}{2C}\right)}\right\} Vdd + \frac{Q}{2C+Cg} \quad [\text{FORMULA 20}]$$

When low-level signals are input to the terminal A and the terminal B, Vg is expressed in Formula 21.

$$Vg(A=0, B=0, Q) = \left\{1 - \frac{1}{\left(1+\frac{Cg}{2C}\right)}\right\} Vdd + \frac{Q}{2C+Cg} \quad [\text{FORMULA 21}]$$

Formula 22 is derived from Formulae 18 to 21.

$$Vg(A=1,B=1,Q) > Vg(A=0,B=1,Vg(A=1,B=0,Q) > Vg(A=0,B=0,Q) \quad [\text{FORMULA 22}]$$

Assuming that electric charge applied through the first transistor 104 is Q2, it is found that the relation of Table 3 is met when Q2 satisfies Formula 23.

$$Vg(A=1,B=1,Q=Q2) > Vthp > Vg(A=1,B=0,Q=Q2) \quad [\text{FORMULA 23}]$$

Specifically, assuming that a potential supplied (while A is 0 and B is 0) is Vg2, Vg2 satisfies Formula 24.

$$Vthp + Vdd\left\{\frac{Cg}{2C + Cg}\right\} < Vg2 < Vthp + Vdd\left\{\frac{C + Cg}{2C + Cg}\right\} \quad \text{[FORMULA 24]}$$

Assuming that electric charge applied through the first transistor 104 is Q3, it is found that the relation of Table 4 is met when Q3 satisfies Formula 25.

$$Vg(A=1,B=1,Q=Q3) > Vthp > Vg(A=1,B=0,Q=Q3) \quad \text{[FORMULA 25]}$$

Specifically, assuming that a potential supplied (while A is 0 and B is 0) is Vg3, Vg3 satisfies Formula 26.

$$Vthp + Vdd\left\{\frac{C + Cg}{2C + Cg}\right\} < Vg3 < Vthp + Vdd \quad \text{[FORMULA 26]}$$

When a transistor including an oxide semiconductor in a channel formation region is used as the first transistor 104, the logic circuit can have both a function of performing logic operation and a function of storing data.

Unlike in Embodiment 1, Q may be larger than 0 in this embodiment. The combination of Q=0 and Q>0 is used; thus, a signal of 0 and a signal of a positive value can be employed as signals input through the first transistor 104. The combination of signals input to the first transistor 104 in this embodiment is preferable to that in Embodiment 1.

According to one embodiment of the present invention, since dynamic reconfiguration can be performed when a transistor (OSFET) is turned on, a pulse may be applied to a gate (or a gate electrode) of the transistor. Thus, the state of the transistor can be determined in a short time.

The function of dynamic reconfiguration according to one embodiment of the present invention is not adversely affected by an input signal because the function can be controlled independently of an input signal.

According to one embodiment of the present invention, a problem of leakage current can be solved.

According to one embodiment of the present invention, dynamic reconfiguration can be performed.

According to one embodiment of the present invention, the circuit configuration is simpler than a conventional circuit configuration.

Embodiment 3

In this embodiment, a logic circuit in which the circuit described in Embodiment 1 is combined with the circuit described in Embodiment 2 will be described.

In the circuit described in Embodiment 1 (see FIG. 1), the second transistor 105 is an n-channel transistor. In the circuit described in Embodiment 2 (see FIG. 3), the second transistor 205 is a p-channel transistor. These circuits can be combined to form a CMOS circuit.

Figure 25:
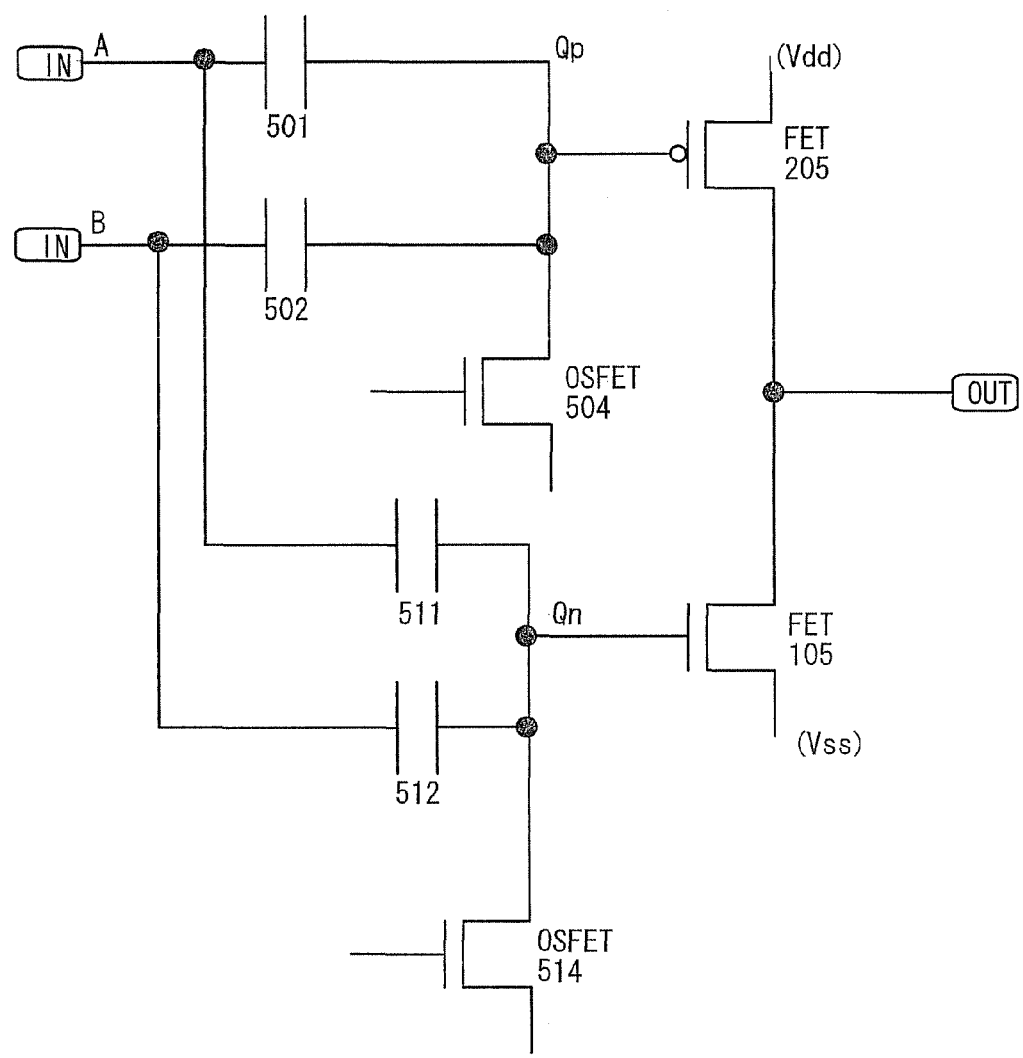
FIG. 25 is a circuit diagram of a logic circuit according to one embodiment of the present invention.

FIG. 25 illustrates a CMOS circuit including a first capacitor 501, a second capacitor 502, a third capacitor 511, a fourth capacitor 512, a first transistor (OSFET) 504, a second transistor (OSFET) 514, a third transistor 205, and a fourth transistor 105. The third transistor 205 and the fourth transistor 105 are a p-channel transistor and an n-channel transistor, respectively.

These components are electrically connected to one another as illustrated in FIG. 25. One electrode of the first capacitor 501 is electrically connected to the terminal A. One electrode of the third capacitor 511 is electrically connected to the terminal A. A signal is input from the terminal A (IN). One electrode of the second capacitor 502 is electrically connected to the terminal B. One electrode of the fourth capacitor 512 is electrically connected to the terminal B. A signal is input from the terminal B (IN). One of a source and a drain of the first transistor (OSFET) 504 is electrically connected to the other electrode of the first capacitor 501. The one of the source and the drain of the first transistor (OSFET) 504 is also electrically connected to a gate of the third transistor (FET) 205. Electric charge of a node connected to the gate of the third transistor 205 is denoted as Qp. Since the first transistor 504 is an n-channel transistor, the drain of the first transistor 504 is electrically connected to the gate of the third transistor (FET) 205. One of a source and a drain of the second transistor (OSFET) 514 is electrically connected to the other electrode of the fourth capacitor 512. The one of the source and the drain of the second transistor (OSFET) 514 is also electrically connected to a gate of the fourth transistor (FET) 105. Electric charge of a node connected to the gate of the fourth transistor 105 is denoted as Qn. Since the second transistor 514 is an n-channel transistor, the drain of the second transistor 514 is electrically connected to the gate of the fourth transistor (FET) 105. One of a source and a drain of the third transistor 205 is electrically connected to one of a source and a drain of the fourth transistor 105, and signals are output (OUT).

Table 5 shows the relation between input signals (IN) input to the terminal A and the terminal B and outputs signals (OUT), which is satisfied in the case where Qn is Q0 (Qn=Qn1) described in Embodiment 1 and Qp is Q3 (Qp=Qp1) described in Embodiment 2.

TABLE 5

| A | B | Qn = Qn1 ($Q_0$) | Qp = Qp1 ($Q_3$) | OUT |
|---|---|---|---|---|
| 1 | 1 | on | off | 0 |
| 0 | 1 | on | off | 0 |
| 1 | 0 | on | off | 0 |
| 0 | 0 | off | on | 1 |

Table 5 shows that NOT-OR(NOR) operation as a logical operation is performed.

Table 6 shows the relation between input signals (IN) input to the terminal A and the terminal B and outputs (OUT), which is satisfied in the case where Qn is Q1 (Qn=Qn2) described in Embodiment 1 and Qp is Q2 (Qp=Qp2) described in Embodiment 2.

TABLE 6

| A | B | Qn = Qn2 ($Q_1$) | Qp = Qp2 ($Q_2$) | OUT |
|---|---|---|---|---|
| 1 | 1 | on | off | 0 |
| 0 | 1 | off | on | 1 |
| 1 | 0 | off | on | 1 |
| 0 | 0 | off | on | 1 |

Table 6 shows that NOT-AND (NAND) operation as a logical operation is performed. Note that Qn2 is smaller than Qn1 and Qp1 is larger than Qp2.

Thus, even a CMOS circuit can be dynamically reconfigurable.

Further, even a CMOS circuit can have a circuit configuration simpler than a conventional configuration.

Embodiment 4

In this embodiment, a logic circuit in which another element is provided to perform AND operation (or logical conjunction) and OR operation (or logic disjunction) will be described.

Figure 4A:
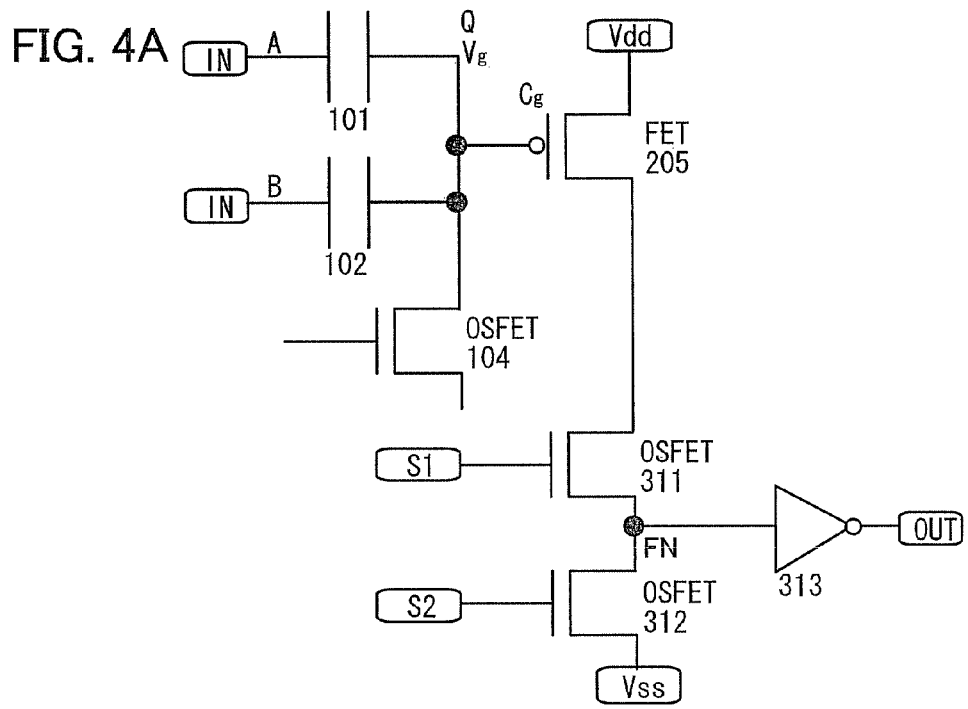
FIG. 4A is a circuit diagram of a logic circuit according to one embodiment of the present invention and FIGS. 4B and 4C are timing charts.

FIG. 4A illustrates a logic circuit including the first capacitor 101, the second capacitor 102, the first transistor (OSFET) 104 whose off-state current is low, the second transistor (FET) 105, a third transistor (OSFET) 311, a fourth transistor (OSFET) 312, and an inverter 313.

The logic circuit in FIG. 4A is different from the logic circuit in FIG. 3 in that the third transistor (OSFET) 311, the fourth transistor (OSFET) 312, and the inverter 313 are additionally provided.

The first transistor 104, the third transistor 311, and the fourth transistor 312 are also denoted as OSFETs because they include oxide semiconductors in channel formation regions. A channel formation region including an oxide semiconductor has n-type conductivity in many cases; thus, the first transistor, the third transistor, and the fourth transistor are n-channel transistors. The off-state current of such a transistor including an oxide semiconductor in a channel formation region is low. A transistor including an oxide semiconductor does not always have to be applied to the third transistor and the fourth transistor since the off state-current of the third transistor and the fourth transistor is not necessarily as low as that of the first transistor.

A transistor including silicon in a channel formation region is used as the second transistor since the off state-current of the second transistor is not necessarily as low as that of the first transistor, the third transistor, and the fourth transistor. The second transistor is a p-channel transistor.

The first capacitor 101, the second capacitor 102, the first transistor 104, the second transistor 205, the third transistor 311, the fourth transistor 312, and the inverter 313 are electrically connected to one another as illustrated in FIG. 4A. One electrode of the first capacitor 101 is electrically connected to a gate of the second transistor 205. One electrode of the second capacitor 102 is electrically connected to the gate of the second transistor 205. The one electrode of the second capacitor 102 is also electrically connected to one of a source and a drain of the first transistor 104. When the first transistor 104 is an n-channel transistor, the drain of the first transistor 104 is electrically connected to the one electrode of the second capacitor 102. One of a source and a drain of the second transistor 205 is electrically connected to one of a source and a drain of the third transistor 311. The other of the source and the drain of the third transistor 311 is electrically connected to one of a source and a drain of the fourth transistor 312. The other of the source and the drain of the third transistor 311 and the one of the source and the drain of the fourth transistor 312 are electrically connected to a first terminal of the inverter 313. The first terminal of the inverter 313 is an input terminal. From a second terminal of the inverter 313, signal is output. A second terminal of the inverter 313 is an output terminal. The other of the source and the drain of the second transistor 205 and the other of the source and the drain of the fourth transistor 312 are electrically connected to a high potential power source and a low potential power source, respectively.

On/off of the first transistor 104 is controlled by a signal input to a gate thereof. On/off of the second transistor 205 is controlled by a signal input to the gate thereof. Signals are input from the terminal A and the terminal B. These signals are high-level signals and/or low-level signals. Thus, on/off of the second transistor 205 is controlled in a manner similar to that described in Embodiment 2. When the second transistor 205 is on, Vdd is applied.

On/off of the third transistor 311 is controlled by a signal input to a gate thereof. On/off of the fourth transistor 312 is controlled by a signal input to a gate thereof. The signal input to the gate of the third transistor 311 is a high-level signal or a low-level signal. The signal input to the gate of the fourth transistor 312 is a high-level signal or a low-level signal.

Figure 4B:
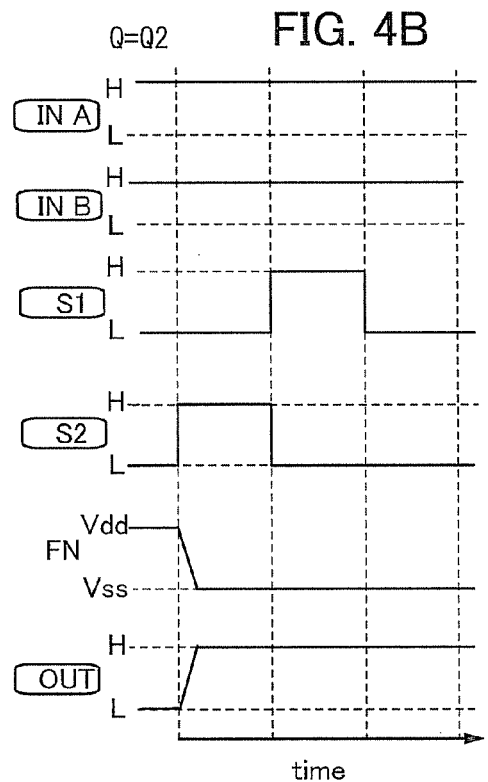

Operations of the logic circuit in FIG. 4A will be described with reference to FIGS. 4B and 4C. Assume that Q=Q2 (corresponding to Table 3) is held and high-level signals (also denoted as H) are being input to the terminal A and the terminal B (See FIG. 4B). In other words, assume that the second transistor 205 is off. First, a control signal S1 becomes at a low level (also denoted as L) and a control signal S2 becomes at a high level (also denoted as H). In response, the third transistor 311 is turned off and the fourth transistor 312 is turned on. The potential of a node FN becomes Vss and an inverter output OUT becomes at a high level (also denoted as H).

Then, the control signal S2 becomes at a low level, and the control signal S1 becomes at a high level. In response, the third transistor 311 is turned on, and the fourth transistor 312 is turned off. The second transistor 205 is off and thus the potential of the node FN remains Vss. Although the potential of the node FN rises gradually due to the leakage current of the second transistor 205, the node FN is maintained at the potential close to Vss for a short time. Thus, the inverter output OUT remains at a high level. As a result of the above operations, an output signal also becomes at a high level when Q=Q2 (corresponding to Table 3) is held and high-level signals are input to the terminal A and the terminal B.

Figure 4C:
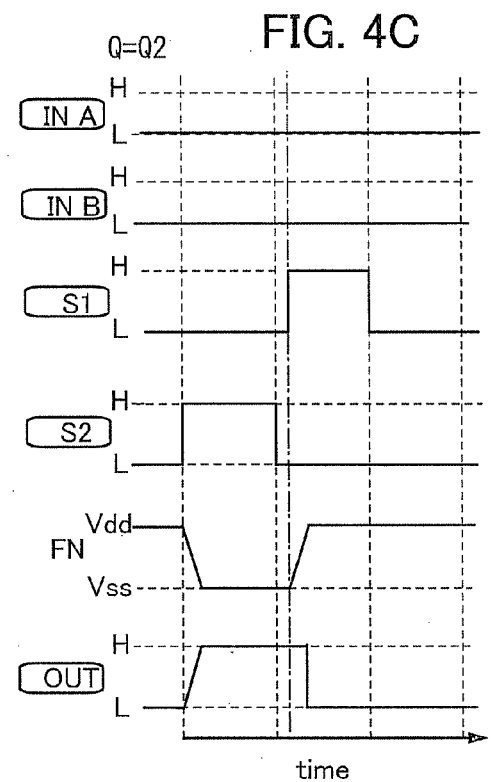

Assume that Q=Q2 (corresponding to Table 3) is held and low-level signals are being input to the terminal A and the terminal B in FIG. 4C. In other words, assume that the second transistor 205 is on. First, the control signal S1 becomes at a low level and the control signal S2 becomes at a high level. In response, the third transistor 311 is turned off and the fourth transistor 312 is turned on. The potential of a node FN becomes Vss and the inverter output OUT becomes at a high level.

Then, the control signal S2 becomes at a low level, and the control signal S1 becomes at a high level. In response, the third transistor 311 is turned on, and the fourth transistor 312 is turned off. The second transistor 205 is on and thus the potential of the node FN becomes Vdd. Thus, the inverter output OUT becomes at a low level. As a result of the above operations, an output signal also becomes at a low level when Q=Q2 (corresponding to Table 3) is held and low-level signals are input to the terminal A and the terminal B. Note that when the control signal S2 and the control signal S1 become at a low level, the third transistor 311 and the fourth transistor 312 are turned off, so that the potential of the node FN is maintained. The potential of the node FN can be stably retained for a long time because it is maintained by the off state of the OSFETs.

The above operations show that the circuit in FIG. 4A outputs a low-level signal when the second transistor 205 is on, and outputs a high-level signal when the second transistor 205 is off. Thus, a truth table of the circuit illustrated in FIG. 4A is obtained based on Tables 3 and 4. Table 7 is the truth table.

TABLE 7

| A | B | Q = Q2 OUT | Q = Q3 OUT |
|---|---|---|---|
| 1 | 1 | 1 | 1 |
| 0 | 1 | 0 | 1 |
| 1 | 0 | 0 | 1 |
| 0 | 0 | 0 | 0 |

When Q is Q2 and signals (1,1) are input to the terminal A and the terminal B, the second transistor 205 is turned off. Thus, the OUT is at a high level. When signals (1,0), (0,1), or (0,0) are input to the terminal A and the terminal B, the second transistor 205 is turned on. Thus, the OUT is at a low level. That is, these results reveal that this circuit is an AND circuit.

When Q is Q3 and signals (1,1), (1,0), and (0,1) are input to the terminal A and the terminal B, the second transistor 205 is turned off. Thus, the OUT is at a high level. When signals (0,0) are input to the terminal A and the terminal B, the second transistor 205 is turned on. Thus, the OUT is at a low level. That is, these results reveals that this circuit is an OR circuit.

Such a logic circuit needs to hold the node potential on the input terminal side of the inverter 313. Instead of the inverter 313, a switch, a buffer, or the like can be provided.

Embodiment 5

In this embodiment, a description will be given of field-effect transistors which are applicable to transistors (e.g., the first transistor, the third transistor, and the fourth transistor) whose off-state current needs to be low in the logic circuit according to any of the above embodiments. The field-effect transistors each include an oxide semiconductor layer in a channel formation region.

Structural examples of the transistors in this embodiment will be described with reference to FIGS. 5A and 5B.

Figure 5A:
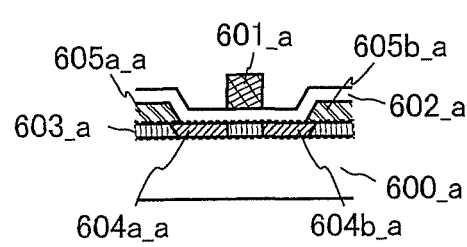
FIGS. 5A and 5B are views illustrating structures of transistors.

A transistor in FIG. 5A includes a conductive layer 601_a, an insulating layer 602_a, a semiconductor layer 603_a, a conductive layer 605a_a, and a conductive layer 605b_a.

The semiconductor layer 603_a includes a region 604a_a and a region 604b_a, which are apart from each other and to each of which a dopant is added. A region between the region 604a_a and the region 604b_a serves as a channel formation region. The semiconductor layer 603_a is provided over an element formation layer 600_a. Although it is not necessary to provide the region 604a_a and the region 604b_a, provision of the region 604a_a and the region 604b_a leads to a reduction in resistance and an increase in mobility in some cases.

The conductive layer 605a_a and the conductive layer 605b_a are provided over the semiconductor layer 603_a to be electrically connected to the semiconductor layer 603_a. Further, side surfaces (on the inner side) of the conductive layer 605a_a and the conductive layer 605b_a are tapered. The region 604a_a and the region 604b_a can be formed using the conductive layer 605a_a and the conductive layer 605b_a as part of a mask.

The conductive layer 605a_a overlaps with the region 604a_a so that the resistance between the conductive layer 605a_a and the region 604a_a can be small. However, one embodiment of the present invention is not necessarily limited thereto. Further, a region of the semiconductor layer 603_a which overlaps with the conductive layer 605a_a may be wholly the region 604a_a to which a dopant is added. However, one embodiment of the present invention is not necessarily limited thereto.

The conductive layer 605b_a overlaps with the region 604b_a so that the resistance between the conductive layer 605b_a and the region 604b_a can be small. However, one embodiment of the present invention is not necessarily limited thereto. Further, a region of the semiconductor layer 603_a which overlaps with the conductive layer 605b_a may be wholly the region 604b_a to which a dopant is added.

The insulating layer 602_a is provided over the semiconductor layer 603_a, the conductive layer 605a_a, and the conductive layer 605b_a. The insulating layer 602_a serves as a gate insulating film.

The conductive layer 601_a is provided over part of the insulating layer 602_a and overlaps with the semiconductor layer 603_a with the insulating layer 602_a interposed therebetween. A region of the semiconductor layer 603_a which overlaps with the conductive layer 601_a with the insulating layer 602_a interposed therebetween is the channel formation region. The region 604a_a and the region 604b_a can be formed using the conductive layer 601_a as part of a mask.

Figure 5B:
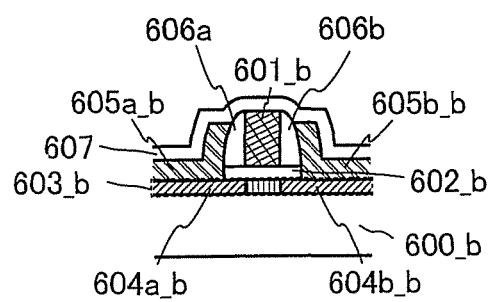

A transistor in FIG. 5B includes a conductive layer 601_b, an insulating layer 602_b, a semiconductor layer 603_b, a conductive layer 605a_b, a conductive layer 605b_b, an insulating layer 606a, an insulating layer 606b, and an insulating layer 607.

The semiconductor layer 603_b includes a region 604a_b and a region 604b_b, which are apart from each other and to each of which a dopant is added. The semiconductor layer 603_b is, for example, provided over an element formation layer 600_b and electrically connected to the conductive layer 605a_b and the conductive layer 605b_b. Although it is not necessary to provide the region 604a_b and the region 604b_b, provision of the region 604a_b and the region 604b_b leads to a reduction in resistance and an increase in mobility in some cases.

The insulating layer 602_b is provided over part of the semiconductor layer 603_b.

The conductive layer 601_b is provided over part of the insulating layer 602_b and overlaps with the semiconductor layer 603_b with the insulating layer 602_b interposed therebetween. A region of the semiconductor layer 603_b which overlaps with the conductive layer 601_b with the insulating layer 602_b interposed therebetween is a channel formation region of the transistor. Note that an insulating layer may be provided over the conductive layer 601_b.

The insulating layer 606a is provided over the insulating layer 602_b and is in contact with one of a pair of side surfaces of the conductive layer 601_b. The insulating layer 606b is provided over the insulating layer 602_b and is in contact with the other of the pair of side surfaces of the conductive layer 601_b. The insulating layer 606a and the insulating layer 606b are called sidewalls.

Note that the concentration of the dopant of part of the region 604a_b and part of the region 604b_b which overlap with the insulating layer 606a and the insulating layer 606b, respectively, with the insulating layer 602_b interposed therebetween may be lower than that of part of the dopant of the region 604a_b and part of the region 604b_b which do not overlap with the insulating layer 606a and the insulating layer 606b, respectively. The concentration of the dopant may be lowered gradually toward the channel formation region.

The conductive layer 605a_b and the conductive layer 605b_b are provided over the semiconductor layer 603_b.

The conductive layer 605a_b is electrically connected to the region 604a_b. Further, the conductive layer 605a_b is in contact with the insulating layer 606a.

The conductive layer 605*b*_*b* is electrically connected to the region 604*b*_*b*. Further, the conductive layer 605*b*_*b* is in contact with the insulating layer 606*b*.

The insulating layer 606*a* can prevent the contact between the conductive layer 601_*b* and the conductive layer 605*a*_*b*. The insulating layer 606*b* can prevent the contact between the conductive layer 601_*b* and the conductive layer 605*b*_*b*.

The insulating layer 607 is provided over the conductive layer 601_*b*, the conductive layer 605*a* b, the conductive layer 605*b*_*b*, the insulating layer 606*a*, and the insulating layer 606*b*.

Further, the components illustrated in FIGS. 5A and 5B will be described.

As the element formation layer 600_*a* and the element formation layer 600_*b*, insulating layers, substrates having insulating surfaces, or the like can be used, for example. Alternatively, layers over which elements are formed in advance can be used as the element formation layer 600_*a* and the element formation layer 600_*b*.

Each of the conductive layers 601_*a* and 601_*b* functions as a gate of the transistor. Note that a layer functioning as a gate of the transistor is also referred to as a gate electrode or a gate wiring.

As each of the conductive layers 601_*a* and 601_*b*, it is possible to use, for example, a layer of a metal material such as molybdenum, magnesium, titanium, chromium, tantalum, tungsten, aluminum, copper, neodymium, or scandium or an alloy material containing any of these materials as a main component. A stack of any of the metal materials, a stack of any of the alloy materials, or a stack of them may be used for each of the conductive layers 601_*a* and 601_*b*. The work functions of these materials are considered.

Each of the insulating layers 602_*a* and 602_*b* functions as a gate insulating layer of the transistor.

As each of the insulating layers 602_*a* and 602_*b*, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, or a lanthanum oxide layer can be used. Alternatively, each of the insulating layers 602_*a* and 602_*b* may be formed using a stack of any of the above materials.

Alternatively, as each of the insulating layers 602_*a* and 602_*b*, an insulating layer of a material containing, for example, an element that belongs to Group 13 in the periodic table and oxygen may be used. For example, when each of the semiconductor layers 603_*a* and 603_*b* contains an element that belongs to Group 13, the use of insulating layers each containing an element that belongs to Group 13 as insulating layers in contact with the semiconductor layers 603_*a* and 603_*b* enables the states of interfaces between the insulating layers and the oxide semiconductor layers to be favorable.

Examples of the material containing an element that belongs to Group 13 and oxygen include gallium oxide, aluminum oxide, aluminum gallium oxide, and gallium aluminum oxide. Note that aluminum gallium oxide refers to a substance in which the amount of aluminum is larger than that of gallium in atomic percent, and gallium aluminum oxide refers to a substance in which the amount of gallium is larger than or equal to that of aluminum in atomic percent. For example, a material represented by $Al_2O_x$ (x=3+a, where a is larger than 0 and smaller than 1), $Ga_2O_x$ (x=3+a, where a is larger than 0 and smaller than 1), or $Ga_xAl_{2-x}O_{3+a}$ (x is larger than 0 and smaller than 2 and a is larger than 0 and smaller than 1) may be used.

Each of the insulating layers 602_*a* and 602_*b* can be formed using a stack of any of the above materials which can be used for the insulating layers 602_*a* and 602_*b*. For example, each of the insulating layers 602_*a* and 602_*b* can be formed using a stack of a plurality of layers containing gallium oxide represented by $Ga_2O_x$. Alternatively, each of the insulating layers 602_*a* and 602_*b* may be formed using a stack of an insulating layer containing gallium oxide represented by $Ga_2O_x$ and an insulating layer containing aluminum oxide represented by $Al_2O_x$.

Each of the semiconductor layers 603_*a* and 603_*b* functions as a layer in which a channel of the transistor is formed. As oxide semiconductors which can be applied to the semiconductor layer 603_*a* and the semiconductor layer 603_*b*, for example, an In-based oxide (e.g., indium oxide), a Sn-based oxide (e.g., tin oxide), and a Zn-based oxide (e.g., zinc oxide) can be given.

As the metal oxide, a four-component metal oxide, a three-component metal oxide, or a two-component metal oxide may be used, for example. Note that a metal oxide which can be used as the above oxide semiconductor may contain gallium as a stabilizer for reducing variation in characteristics. A metal oxide which can be used as the above oxide semiconductor may contain tin as a stabilizer (or an agent to become stable). A metal oxide which can be used as the above oxide semiconductor may contain hafnium as a stabilizer. A metal oxide which can be used as the above oxide semiconductor may contain aluminum as a stabilizer. A metal oxide which can be used as the above oxide semiconductor may contain one or more of following materials as a stabilizer: lanthanum, cerium, praseodymium, neodymium, samarium, europium, gadolinium, terbium, dysprosium, holmium, erbium, thulium, ytterbium, and lutetium which are lanthanoid. Further, the metal oxide that can be used as the oxide semiconductor may contain silicon oxide.

For example, as a four-component metal oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, or the like can be used.

As a three-component metal oxide, for example, an In—Ga—Zn-based oxide (also referred to as IGZO), an In—Sn—Zn-based oxide, an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, or the like can be used.

As the binary metal oxide, for example, an In—Zn-based oxide, a Sn—Zn-based oxide, an Al—Zn-based oxide, a Zn—Mg-based oxide, a Sn—Mg-based oxide, an In—Mg-based oxide, an In—Sn-based oxide, an In—Ga-based oxide, or the like can be used.

Note that, for example, an In—Ga—Zn-based oxide means an oxide containing In, Ga, and Zn, and there is no limitation on the composition ratio of In, Ga, and Zn. The In—Ga—Zn-based oxide may further contain a metal element other than In, Ga, and Zn.

As the oxide semiconductor, a material represented by $InLO_3(ZnO)_m$ (m is larger than 0) may be used. Here, L in $InLO_3(ZnO)_m$ represents one or more metal elements selected from Ga, Al, Mn, and Co.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used as the oxide semiconductor. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used as the oxide semiconductor.

Note that one embodiment of the disclosed invention is not limited thereto, and a material having appropriate composition depending on semiconductor characteristics (mobility, threshold voltage, variation, and the like) may be used. Further, it is preferable to appropriately set the carrier concentration, the impurity concentration, the defect density, the atomic ratio of a metal element and oxygen, the interatomic distance, the density, or the like in order to obtain necessary semiconductor characteristics.

The oxide semiconductor may have a single crystal structure.

Alternatively, the oxide semiconductor may have a non-single-crystal structure.

In the case where the oxide semiconductor has a non-single-crystal structure, the non-single-crystal oxide semiconductor may be amorphous.

In the case where the oxide semiconductor has a non-single-crystal structure, the non-single-crystal oxide semiconductor may be polycrystalline.

The oxide semiconductor may have either an amorphous structure including a portion having crystallinity or a non-amorphous structure.

The oxide semiconductor can have the above structure depending on the composition ratio thereof. Alternatively, the oxide semiconductor can have the above structure depending on the thickness thereof. Alternatively, the oxide semiconductor can have the above structure depending on heat treatment performed thereon, the substrate temperature in film formation, or the like.

For the semiconductor layer 603_a and the semiconductor layer 603_b, a layer containing an oxide including a crystal with c-axis alignment (also referred to as a c-axis aligned crystal (CAAC)), which has a triangular or hexagonal atomic arrangement when seen from the direction of an a-b plane, a surface, or an interface can be used. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., the direction perpendicular to a surface of a substrate over which the CAAC is formed or a surface of the CAAC). Alternatively, the normals of the a-b planes of the individual crystalline portions included in the CAAC may be aligned in one direction (e.g., the direction perpendicular to a surface of a substrate over which the CAAC is formed or a surface of the CAAC).

The oxide semiconductor can be a conductor, a semiconductor, or an insulator depending on its composition or the like. The oxide semiconductor transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a substrate over which the CAAC is formed, and in which metal atoms are arranged in a layered manner or metal atoms and oxygen atoms (or nitrogen atoms) are arranged in a layered manner when a cross section of the film is observed.

As the oxide semiconductor, a semiconductor layer including a crystalline region with c-axis alignment may be used. Note that the composition of the crystalline region with c-axis alignment is represented by $In_{1+\delta}Ga_{1-\delta}O_3(ZnO)_m$ ($0<\delta<1$, $1\leq M\leq 3$), and the composition of the entire semiconductor layer including the crystalline region with c-axis alignment is represented by $In_PGa_QO_R(ZnO)_M$ ($0<P<2$, $0<Q<2$, $1\leq M\leq 3$).

Further, in the case where the semiconductor layer 603_a and the semiconductor layer 603_b are CAAC oxide semiconductor layers and the channel length of a transistors is 30 nm, even when the thickness of each of the semiconductor layer 603_a and the semiconductor layer 603_b is, for example, approximately 5 nm, short channel effects in the transistors can be suppressed.

Here, an example of a crystal structure of the CAAC will be further described with reference to FIGS. 6A to 6E, FIGS. 7A to 7C, and FIGS. 8A to 8C. In FIGS. 6A to 6E, FIGS. 7A to 7C, and FIGS. 8A to 8C, the vertical direction corresponds to the c-axis direction and a plane perpendicular to the c-axis direction corresponds to the a-b plane, unless otherwise specified. When the expressions "upper half" and "lower half" are simply used, they refer to the upper half above the a-b plane and the lower half below the a-b plane (the upper half and the lower half with respect to the a-b plane). Further, in FIGS. 6A to 6E, O surrounded by a circle represents tetracoordinate O and a double circle represents tricoordinate O.

Figure 6A:
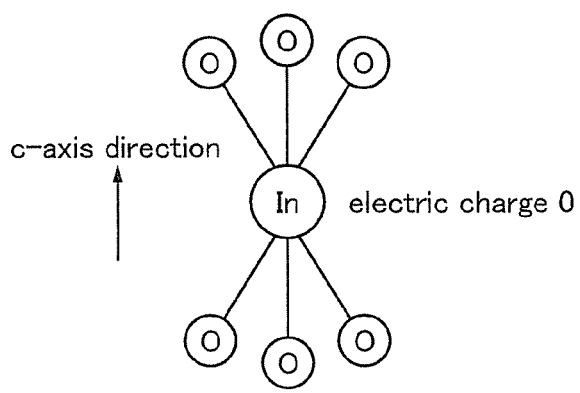
FIGS. 6A to 6E are diagrams each illustrating a CAAC structure.

FIG. 6A illustrates a structure including one hexacoordinate indium (also referred to as hexacoordinate In) atom and six tetracoordinate oxygen (also referred to as tetracoordinate O) atoms proximate to the In atom. Note that a portion including one metal atom such as In and oxygen atoms proximate thereto is referred to as a small group. The small group in FIG. 6A is actually an octahedral structure, but is illustrated as a planar structure for simplicity. Note that three tetracoordinate O atoms exist in each of the upper half and the lower half in FIG. 6A. In the small group illustrated in FIG. 6A, electric charge is 0.

Figure 6D:
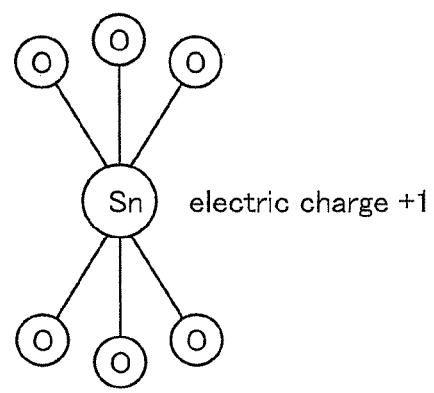
Figure 6B:
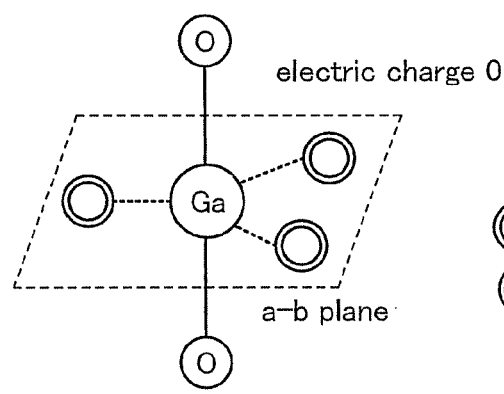

FIG. 6B illustrates a structure including one pentacoordinate Ga atom, three tricoordinate oxygen (also referred to as tricoordinate O) atoms proximate to the pentacoordinate Ga atom, and two tetracoordinate O atoms proximate to the pentacoordinate Ga atom. All the three tricoordinate O atoms exist on the a-b plane. One tetracoordinate O atom exists in each of the upper half and the lower half in FIG. 6B. The structure illustrated in FIG. 6B may include one pentacoordinate In atom, three tricoordinate O atoms, and two tetracoordinate O atoms because there is not only a tetracoordinate In atom but also a pentacoordinate In atom. In the small group illustrated in FIG. 6B, electric charge is 0.

Figure 6E:
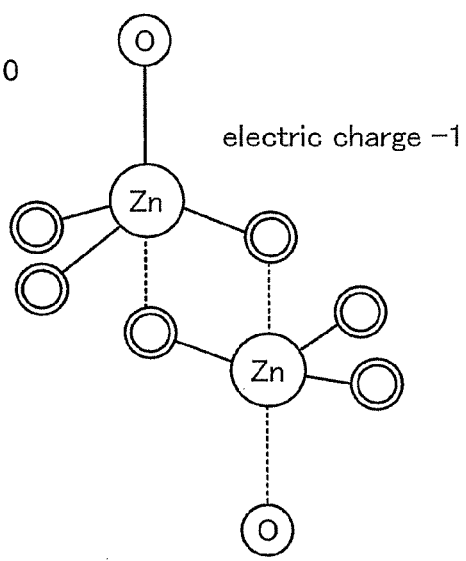
Figure 6C:
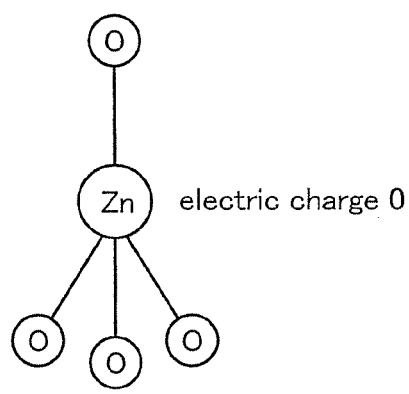

FIG. 6C illustrates a structure including one tetracoordinate zinc (also referred to as tetracoordinate Zn) atom and four tetracoordinate O atoms proximate to the tetracoordinate Zn atom. In FIG. 6C, one tetracoordinate O atom exists in the upper half and three tetracoordinate O atoms exist in the lower half. Alternatively, three tetracoordinate O atoms may exist in the upper half and one tetracoordinate O atom may exist in the lower half in FIG. 6C. In the small group illustrated in FIG. 6C, electric charge is 0.

FIG. 6D illustrates a structure including one hexacoordinate tin (also referred to as hexacoordinate Sn) atom and six tetracoordinate O atoms proximate to the hexacoordinate Sn atom. In FIG. 6D, three tetracoordinate O atoms exist in each of the upper half and the lower half. In the small group illustrated in FIG. 6D, electric charge is +1.

FIG. 6E illustrates a small group including two zinc atoms. In FIG. 6E, one tetracoordinate O atom exists in each of the upper half and the lower half. In the small group illustrated in FIG. 6E, electric charge is −1.

Note that a plurality of small groups form a medium group, and a plurality of medium groups form a large group (also referred to as a unit cell).

Now, a rule of bonding between the small groups will be described. For example, the three tetracoordinate O atoms in the upper half with respect to the hexacoordinate In atom are each bonded to three proximate hexacoordinate In atoms in the downward direction, and the three tetracoordinate O atoms in the lower half are each bonded to three proximate hexacoordinate In atoms in the upward direction. The one tricoordinate O atom in the upper half with respect to the pentacoordinate Ga atom is bonded to one proximate pentacoordinate Ga atom in the downward direction, and the one tricoordinate O atom in the lower half is bonded to one proximate pentacoordinate Ga atom in the upward direction. The one tetracoordinate O atom in the upper half with respect to the tetracoordinate Zn atom is bonded to one proximate tetracoordinate Zn atom in the downward direction, and the three tetracoordinate O atoms in the lower half are each bonded to three proximate tetracoordinate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. In this case, since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or in) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 7A:
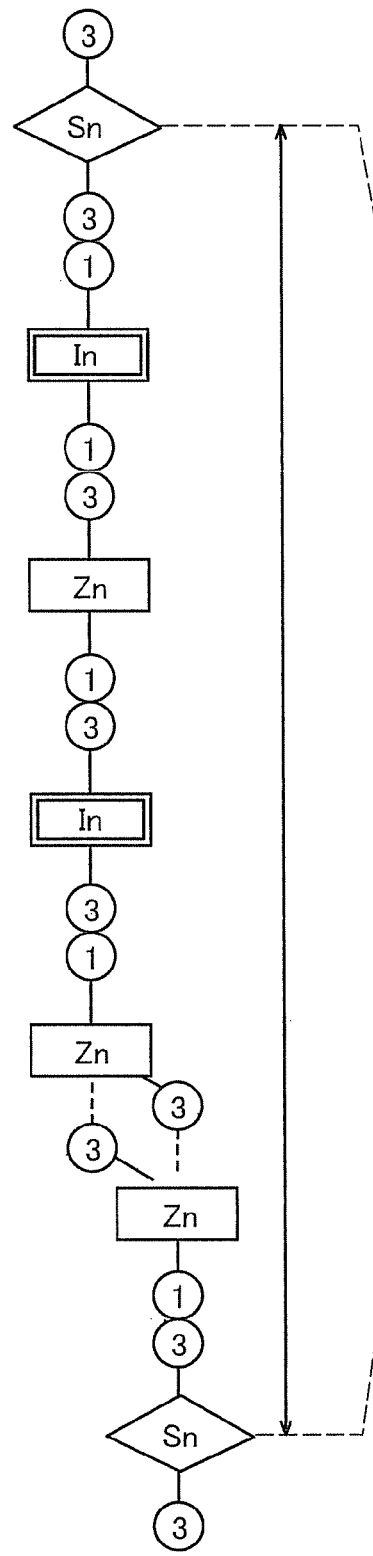
FIGS. 7A to 7C are diagrams illustrating a CAAC structure.
Figure 7B:
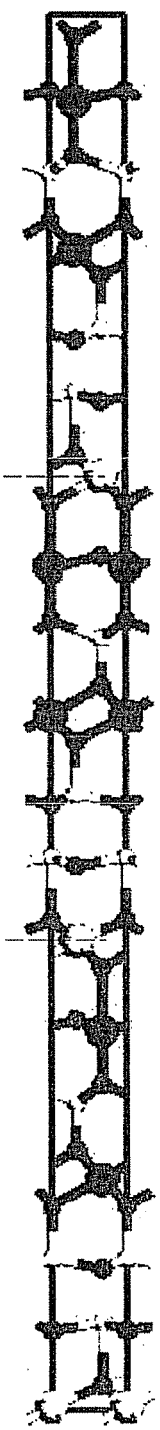
Figure 7C:
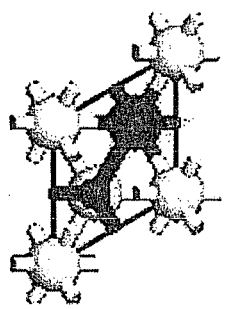

FIG. 7A illustrates a model of a medium group included in a layered structure of an In—Sn—Zn-based material. FIG. 7B illustrates a large group including three medium groups. Note that FIG. 7C illustrates an atomic arrangement in the case where the layered structure in FIG. 7B is observed from the c-axis direction.

In FIG. 7A, a tricoordinate O atom is omitted for simplicity, and a tetracoordinate O atom is illustrated by a circle; the number in the circle shows the number of tetracoordinate O atoms. For example, three tetracoordinate O atoms existing in each of the upper half and the lower half with respect to a Sn atom are denoted by circled 3. Similarly, in FIG. 7A, one tetracoordinate O atom existing in each of the upper half and the lower half with respect to an In atom is denoted by circled 1. FIG. 7A also illustrates a Zn atom proximate to one tetracoordinate O atom in the lower half and three tetracoordinate O atoms in the upper half, and a Zn atom proximate to one tetracoordinate O atom in the upper half and three tetracoordinate O atoms in the lower half.

In the medium group included in the layered structure of the In—Sn—Zn—O-based material in FIG. 7A, in the order starting from the top, a Sn atom proximate to three tetracoordinate O atoms in each of the upper half and the lower half is bonded to an In atom proximate to one tetracoordinate O atom in each of the upper half and the lower half, the In atom is bonded to a Zn atom proximate to three tetracoordinate O atoms in the upper half, the Zn atom is bonded to an In atom proximate to three tetracoordinate O atoms in each of the upper half and the lower half through one tetracoordinate O atom in the lower half and the Zn atom, the In atom is bonded to a small group that includes two Zn atoms and is proximate to one tetracoordinate O atom in the upper half, and the small group is bonded to a Sn atom proximate to three tetracoordinate O atoms in each of the upper half and the lower half through one tetracoordinate O atom in the lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 6E can be given. For example, with one small group including two Zn atoms, electric charge of one small group including a Sn atom can be cancelled, so that the total electric charge of the layered structure can be 0.

Further, when the large group illustrated in FIG. 7B is repeated, an In—Sn—Zn-based crystal ($In_2SnZn_3O_8$) can be obtained. Note that a layered structure of the obtained In—Sn—Zn-based crystal can be expressed by a composition formula, $In_2SnZn_2O_7(ZnO)_m$ (m is 0 or a natural number).

The above description also applies to the case of using the four-component metal oxide, the three-component metal oxide, the two-component metal oxide, or any other metal oxide which are described in this embodiment.

Figure 8A:
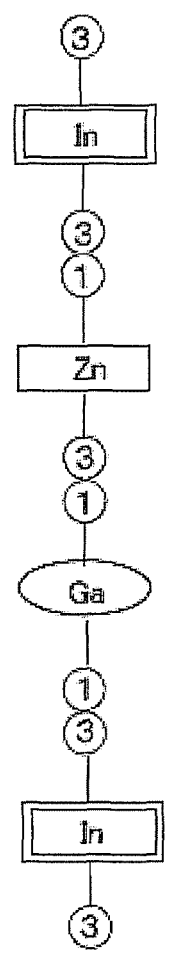
FIGS. 8A to 8C are diagrams illustrating a CAAC structure.

As an example, FIG. 8A illustrates a model of a medium group included in a layered structure of an In—Ga—Zn-based material.

In the medium group included in the layered structure of the In—Ga—Zn-based material in FIG. 8A, in the order starting from the top, an In atom proximate to three tetracoordinate O atoms in each of the upper half and the lower half is bonded to a Zn atom proximate to one tetracoordinate O atom in the upper half, the Zn atom is bonded to a Ga atom proximate to one tetracoordinate O atom in each of the upper half and the lower half through three tetracoordinate O atoms in the lower half with respect to the Zn atom, and the Ga atom is bonded to an In atom proximate to three tetracoordinate O atoms in each of the upper half and the lower half through one tetracoordinate O atom in the lower half with respect to the Ga atom. A plurality of such medium groups is bonded, so that a large group is formed.

Figure 8B:
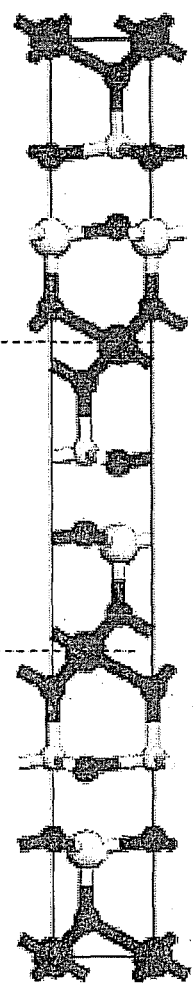
Figure 8C:
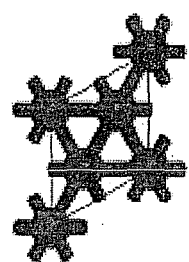

FIG. 8B illustrates a large group including three medium groups. Note that FIG. 8C illustrates an atomic arrangement in the case where the layered structure in FIG. 8B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 8A but also a medium group in which the arrangement of the In atom, the Ga atom, and the Zn atom is different from that in FIG. 8A.

Specifically, when the large group illustrated in FIG. 8B is repeated, an In—Ga—Zn—O-based crystal can be obtained. Note that a layered structure of the obtained In—Ga—Zn—O-based crystal can be expressed by a composition formula, $InGaO_3(ZnO)_n$ (n is a natural number).

Figure 24A:
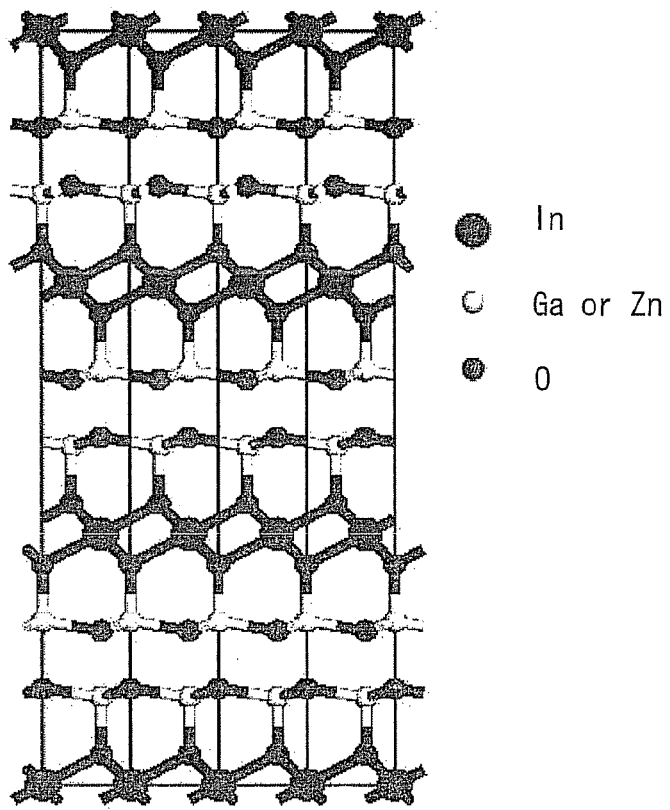
FIGS. 24A and 24B are diagrams each illustrating a CAAC structure.

In the case where n is 1 ($InGaZnO_4$), a crystal structure illustrated in FIG. 24A can be obtained, for example. Note that in the crystal structure in FIG. 24A, since a Ga atom and an In atom each have five ligands as described in FIG. 6B, a structure in which Ga is replaced with In can be obtained.

Figure 24B:
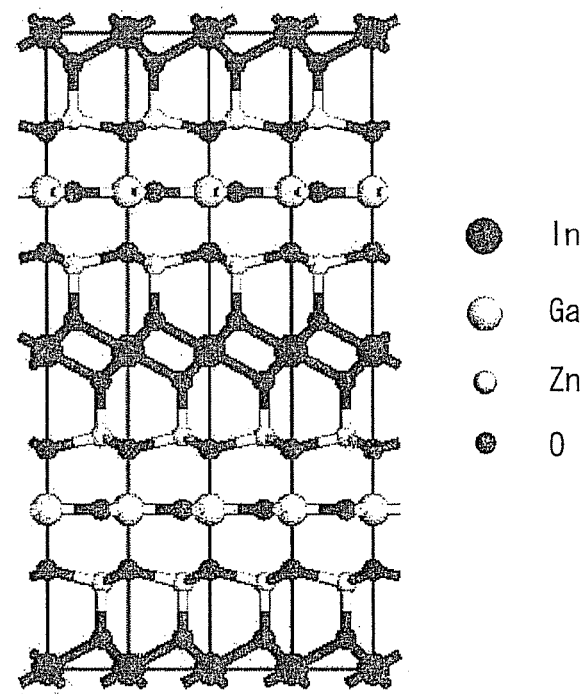

In the case where n is 2 ($InGaZn_2O_5$), a crystal structure illustrated in FIG. 24B can be obtained, for example. Note that in the crystal structure in FIG. 24B, since a Ga atom and an In atom each have five ligands as described in FIG. 6B, a structure in which Ga is replaced with In can be obtained.

The above is a description of the structural example of the CAAC. In a crystalline oxide semiconductor such as a CAAC oxide semiconductor, the number of defects in the bulk is small.

Dopants are added to the region $604a\_a$, the region $604b\_a$, the region $604a\_b$, and the region $604b\_b$ which are illustrated in FIGS. 5A and 5B, and the region $604a\_a$, the region $604b\_a$, the region $604a\_b$, and the region $604b\_b$ function as sources and drains of the transistors. As the dopant which is added, for example, one or more of elements of Group 13 in the periodic table (e.g., boron), elements of Group 15 in the periodic table (e.g., one or more of nitrogen, phosphorus, and arsenic), and rare gas elements (e.g., one or more of helium, argon, and xenon) can be used. A region functioning as a source of a transistor is also referred to as a source region, and a region functioning as a drain of a transistor is also referred to as a drain region. Addition of the dopants to the region $604a\_a$, the region $604b\_a$, the region $604a\_b$, and the region $604b\_b$ enables reduction in resistance between the conductive layers and these regions; therefore, the transistor can be downsized.

The conductive layers $605a\_a$, $605b\_a$, $605a\_b$, and $605b\_b$ function as the sources and the drains of the transistors. Note that a layer functioning as a source of a transistor can also be called a source electrode or a source wiring, and a layer functioning as a drain of a transistor can also be called a drain electrode or a drain wiring. Source electrodes and drain electrodes are not provided, and the conductive layers $605a\_a$, $605b\_a$, $605a\_b$, and $605b\_b$ are provided as source wirings and drain wirings. Accordingly, high integration can be achieved.

Each of the conductive layers $605a\_a$, $605b\_a$, $605a\_b$, and $605b\_b$ can be formed, using, for example, a layer of a metal material such as aluminum, magnesium, chromium, copper, tantalum, titanium, molybdenum, or tungsten; or an alloy material which contains the above metal material as a main component. For example, each of the conductive layers $605a\_a$, $605b\_a$, $605a\_b$, and $605b\_b$ can be formed using a layer of an alloy material containing copper, magnesium, and aluminum. Alternatively, each of the conductive layers $605a\_a$, $605b\_a$, $605a\_b$, and $605b\_b$ may be formed using a stack of layers of materials which can be used for the conductive layers $605a\_a$, $605b\_a$, $605a\_b$, and $605b\_b$. For example, each of the conductive layers $605a\_a$, $605b\_a$, $605a\_b$, and $605b\_b$ can be formed using a stack including a layer of an alloy material containing copper, magnesium, and aluminum and a layer containing copper.

A layer containing a conductive metal oxide may be used as each of the conductive layers $605a\_a$, $605b\_a$, $605a\_b$, and $605b\_b$. As the conductive metal oxide, it is possible to use indium oxide, tin oxide, zinc oxide, indium tin oxide, or indium zinc oxide, for example. Note that the conductive metal oxide which can be used for the conductive layers $605a\_a$, $605b\_a$, $605a\_b$, and $605b\_b$ may contain silicon oxide.

For each of the insulating layers $606a$ and $606b$, for example, a layer of a material that can be used for the insulating layers $602\_a$ and $602\_b$ can be used. Alternatively, each of the insulating layers $606a$ and $606b$ can be formed using a stack of layers of materials that can be used for the insulating layers $606a$ and $606b$.

The insulating layer 607 functions as a protective insulating layer which suppresses the entry of an impurity into the transistor.

For the insulating layer 607, for example, a layer of a material which can be used for the insulating layers $602\_a$ and $602\_b$ can be used. Alternatively, the insulating layer 607 may be formed using a stack of layers of materials which can be used for the insulating layer 607. For example, the insulating layer 607 may be formed using a silicon oxide layer, an aluminum oxide layer, or the like. For example, the use of an aluminum oxide layer for the insulating layer 607 can more effectively prevent an impurity from entering the semiconductor layer $603\_b$ and effectively prevent the semiconductor layer $603\_b$ from releasing oxygen.

Note that the transistor of this embodiment may include an insulating layer over part of the oxide semiconductor layer serving as a channel formation layer and a conductive layer serving as a source or a drain and overlapping with the oxide semiconductor layer with the insulating layer interposed therebetween. In the case of the above structure, the insulating layer serves as a layer protecting the channel formation layer (also referred to as a channel protective layer) of the transistor. As the insulating layer functioning as a channel protective layer, a layer of a material which can be used for the insulating layers $602\_a$ and $602\_b$ can be used for example. Alternatively, the insulating layer functioning as a channel protective layer may be formed using a stack of layers of materials which can be used for the insulating layers $602\_a$ and $602\_b$.

Base layers may be formed over the element formation layers $600\_a$ and $600\_b$ and the transistors may be formed over the base layers. In this case, the base layer can be a layer of a material that can be used for the insulating layers $602\_a$ and $602\_b$, for example. Alternatively, the base layer may be formed using a stack of layers of materials which can be used for the insulating layers $602\_a$ and $602\_b$. For example, the base layer formed using a stack of an aluminum oxide layer and a silicon oxide layer can prevent the base layer from releasing oxygen through the semiconductor layers $603\_a$ and $603\_b$.

As an example of a method for manufacturing the transistor according to this embodiment, an example of a method for manufacturing the transistor illustrated in FIG. 5A will be described with reference to FIGS. 9A to 9E. FIGS. 9A to 9E are schematic cross-sectional views illustrating the example of the method for manufacturing the transistor in FIG. 5A.

Figure 9A:
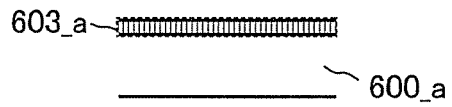
FIGS. 9A to 9E illustrate a method for manufacturing a transistor.

First, as illustrated in FIG. 9A, the element formation layer 600_a is prepared and the semiconductor layer 603_a is formed over the element formation layer 600_a.

For example, a layer of an oxide semiconductor material (also referred to as an oxide semiconductor layer) which can be used for the semiconductor layer 603_a is formed by a sputtering method, so that the semiconductor layer 603_a can be formed. Note that part of the oxide semiconductor layer may be etched after the formation of the oxide semiconductor layer. Further, the oxide semiconductor film can be formed in a rare gas atmosphere, an oxygen atmosphere, or a mixed atmosphere of a rare gas and oxygen.

The oxide semiconductor layer can be formed using an oxide target having a composition ratio of $In_2O_3:Ga_2O_3:ZnO=1:1:1$ [molar ratio] as a sputtering target. Alternatively, for example, an oxide target having a composition ratio of $In_2O_3:Ga_2O_3:ZnO=1:1:2$ [molar ratio] may be used for formation of the oxide semiconductor layer.

Still alternatively, for formation of the oxide semiconductor layer, an oxide target having a composition ratio of In:Sn:Zn=1:2:2 [atomic ratio], 2:1:3 [atomic ratio], 1:1:1 [atomic ratio], or 4:9:7 [atomic ratio] may be used as a sputtering target. When an oxide target having a composition ratio of In:Sn:Zn=2:1:3 [atomic ratio] is used as a sputtering target, for formation of the oxide semiconductor layer, the oxide semiconductor layer can have high crystallinity.

An In—Zn-based oxide layer may be formed using an oxide target having the following composition ratio as a sputtering target: the composition ratio of In:Zn is 50:1 to 1:2 ($In_2O_3:ZnO=25:1$ to 1:4 in a molar ratio), preferably 20:1 to 1:1 ($In_2O_3:ZnO=10:1$ to 1:2 in a molar ratio), more preferably 15:1 to 1.5:1 ($In_2O_3:ZnO=15:2$ to 3:4 in a molar ratio). For example, when the target used for the formation of the In—Zn-based oxide semiconductor layer has an atomic ratio of In:Zn:O=S:U:R, R>1.5S+U is satisfied. An increase in In content allows the field-effect mobility (also simply referred to as the mobility) of the transistor to be higher.

In the case of employing a sputtering method, the semiconductor layer 603_a is formed, for example, in a rare gas (typically, argon) atmosphere, an oxygen atmosphere, or a mixed atmosphere of a rare gas and oxygen. When the semiconductor layer 603_a is formed in a mixed atmosphere of a rare gas and oxygen, it is preferable that the amount of oxygen be larger than that of the rare gas.

Further, in the case of performing film formation by a sputtering method, it is preferable to sufficiently suppress leakage from the outside of a deposition chamber and degassing from the interior wall of the deposition chamber thereof so that impurities such as hydrogen, water, a hydroxyl group, and hydride (also referred to as a hydrogen compound) are not contained in a film to be formed.

For example, before the film is formed by a sputtering method, preheating treatment may be performed in a preheating chamber of a sputtering apparatus. By the preheating treatment, the above impurity can be removed.

Further, before the film is formed by a sputtering method, for example, treatment in which voltage is applied not to the target side but to the substrate side in an argon atmosphere, a nitrogen atmosphere, a helium atmosphere, or an oxygen atmosphere with the use of RF power and plasma is generated so that a surface where the film is to be formed is modified (such treatment is also referred to as reverse sputtering) may be performed. By reverse sputtering, powdery substances (also referred to as particles or dust) attached to the surface where the film is to be formed can be removed.

In the case where the film is formed by a sputtering method, moisture remaining in a deposition chamber in which the film is to be formed can be removed with the use of an entrapment vacuum pump or the like. As the entrapment vacuum pump, a cryopump, an ion pump, or a titanium sublimation pump can be used, for example. Alternatively, moisture remaining in the deposition chamber can be removed with the use of a turbo molecular pump provided with a cold trap. The use of the entrapment vacuum pump permits suppression of the backflow of exhaust air containing the above impurity.

Note that when a high-purity gas from which the above impurities are removed is used as a sputtering gas, for example, the impurity concentration in the film formed can be lowered. For example, a gas with a dew point of −70° C. or lower is preferably used as the sputtering gas.

In the case where part of a film is etched to form a layer in the example of a method for manufacturing the transistor of this embodiment, for example, the following steps can be performed: a resist mask is formed over part of the film through a photolithography process and the film is etched using the resist mask, thereby forming the layer. Note that in this case, the resist mask is removed after the layer is formed.

In the case of forming a CAAC oxide semiconductor layer as the semiconductor layer 603_a, an oxide semiconductor layer is formed by a sputtering method while the temperature of the element formation layer where the oxide semiconductor layer is formed is higher than or equal to 100° C. and lower than or equal to 500° C., preferably higher than or equal to 200° C. and lower than or equal to 350° C. When the oxide semiconductor layer is formed while the temperature of the film formation layer is high, the field-effect mobility of the transistor manufactured can be increased, and the stability against a gate-bias stress can be increased.

In that case, the element formation layer 600_a is preferably flat. The mean surface roughness of the element formation layer 600_a is preferably less than or equal to 1 nm, more preferably less than or equal to 0.3 nm. When the flatness of the element formation layer 600_a is improved, the mobility can be increased to be higher than that of an oxide semiconductor in an amorphous state. The element formation layer 600_a can be planarized by, for example, one of or both chemical mechanical polishing (CMP) treatment and plasma treatment. The plasma treatment includes treatment of sputtering rare gas ions off a surface and treatment of etching a surface with the use of an etching gas.

Figure 9B:
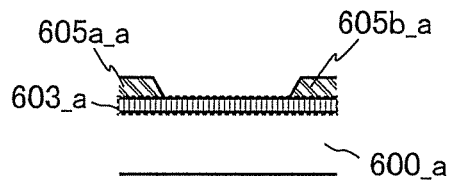

Next, the conductive layers 605a_a and 605b_a are formed over the semiconductor layer 603_a as illustrated in FIG. 9B.

For example, a film of a material applicable to the conductive layers 605a_a and 605b_a is formed as a first conductive film by a sputtering method or the like and the first conductive film is partly etched, whereby the conductive layers 605a_a and 605b_a can be formed.

Figure 9C:
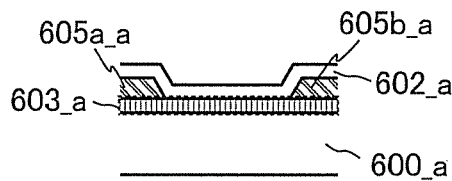
Figure 9D:
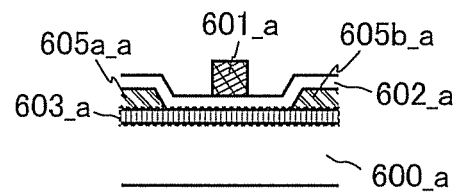

Next, the insulating layer 602_a is formed in contact with the semiconductor layer 603_a as illustrated in FIG. 9C.

For example, the insulating layer 602_a can be formed by formation of a film applicable to the insulating layer 602_a by a sputtering method in a rare gas (typically, argon) atmosphere, an oxygen atmosphere, or a mixed atmosphere of a rare gas and oxygen. The insulating layer 602_a formed by a sputtering method enables suppression of a reduction in resistance of a portion of the oxide semiconductor layer 603_a, which serves as a back channel of the transistor. The temperature of the element formation layer 600_a at the time of the formation of the insulating layer 602_a is preferably higher than or equal to room temperature and lower than or equal to 300° C.

Before the formation of the insulating layer 602_a, plasma treatment with the use of a gas of $N_2O$, $N_2$, Ar, or the like may be performed to remove water or the like adsorbed on an exposed surface of the semiconductor layer 603_a. In the case where the plasma treatment is performed, the insulating layer 602_a is preferably formed after the plasma treatment without exposure to the air.

Then, the conductive layer 601_a is formed over the insulating layer 602_a.

For example, a film of a material applicable to the conductive layer 601_a is formed as a second conductive film by a sputtering method or the like and the second conductive film is partly etched, whereby the conductive layer 601_a can be formed.

Further, in the example of the method for manufacturing the transistor in FIG. 5A, heat treatment is performed, for example, at higher than or equal to 600° C. and lower than or equal to 750° C., or higher than or equal to 600° C. and lower than the strain point of the substrate. For example, the heat treatment is performed after the oxide semiconductor layer is formed, after part of the oxide semiconductor layer is etched, after the first conductive film is formed, after part of the first conductive film is etched, after the insulating layer 602_a is formed, after the second conductive film is formed, or after part of the second conductive film is etched. By the heat treatment, an impurity such as hydrogen, water, a hydroxyl group, or hydride can be removed from the semiconductor layer 603_a.

Note that as a heat treatment apparatus for the heat treatment, an electric furnace or an apparatus for heating an object by heat conduction or heat radiation from a heater such as a resistance heater can be used; e.g., a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, a rare gas or an inert gas (e.g., nitrogen) which does not react with the object due to the heat treatment can be used. Alternatively, laser irradiation may be performed for the heat treatment.

After the heat treatment, a high-purity oxygen gas, a high-purity $N_2O$ gas, or ultra-dry air (with a dew point of −60° C. or lower, preferably −60° C. or lower) may be introduced into the furnace that has been used in the heat treatment while the heating temperature is maintained or decreased. It is preferable that the oxygen gas or the $N_2O$ gas do not contain water, hydrogen, and the like. The purity of the oxygen gas or the $N_2O$ gas which is introduced into the heat treatment apparatus is preferably 6N or higher, more preferably 7N is higher, i.e., the impurity concentration in the oxygen gas or the $N_2O$ gas is preferably 1 ppm or lower, more preferably 0.1 ppm or lower. By the action of the oxygen gas or the $N_2O$ gas, oxygen is supplied to the semiconductor layer 603_a, so that vacancies caused by oxygen deficiency in the semiconductor layer 603_a can be reduced. Note that the introduction of a high-purity oxygen gas, a high-purity $N_2O$ gas, or ultra-dry air may be performed at the time of the above heat treatment.

Further, in the example of the method for manufacturing the transistor in FIG. 5A, oxygen may be added to the oxide semiconductor film by a method in which oxygen ions are accelerated by an electric field, such as oxygen doping treatment using oxygen plasma, after the semiconductor layer 603_a is formed, after the conductive layers 605a_a and 605b_a are formed, after the insulating layer 602_a is formed, after the conductive layer 601_a is formed, or after the heat treatment is performed. For example, oxygen doping treatment using high-density plasma of 2.45 GHz may be performed. The oxygen doping treatment may be performed by an ion implantation method. The oxygen doping treatment allows a reduction in variation of electrical characteristics of transistors to be manufactured. For example, the oxygen doping treatment is performed so that the insulating layer 602_a contains oxygen with a proportion higher than that in the stoichiometric composition.

When the insulating layer in contact with the semiconductor layer 603_a is made to excessively contain oxygen, the oxygen can be more easily supplied to the semiconductor layer 603_a. Thus, oxygen vacancies in the semiconductor layer 603_a or at the interface between the insulating layer 602_a and the semiconductor layer 603_a can be reduced, resulting in further reduction in the carrier concentration in the semiconductor layer 603_a. One embodiment of the present invention is not limited thereto. Even when the semiconductor layer 603_a is made to excessively contain oxygen through manufacturing steps, the insulating layer in contact with the semiconductor layer 603_a can suppress a release of oxygen from the semiconductor layer 603_a.

For example, when an insulating layer containing gallium oxide is formed as the insulating layer 602_a, the composition of the gallium oxide can be set to be $Ga_2O_x$ by supplying the insulating layer with oxygen.

Alternatively, when an insulating layer containing aluminum oxide is formed as the insulating layer 602_a, the composition of the aluminum oxide can be set to be $Al_2O_x$ by supplying the insulating layer with oxygen.

Still alternatively, when an insulating layer containing gallium aluminum oxide or aluminum gallium oxide is formed as the insulating layer 602_a, the composition of the gallium aluminum oxide or the aluminum gallium oxide can be set to be $Ga_xAl_{2-x}O_{3+a}$ by supplying the insulating layer with oxygen.

Through the above steps, an impurity such as hydrogen, water, a hydroxyl group, or hydride (also referred to as a hydrogen compound) is removed from the semiconductor layer 603_a and oxygen is supplied to the semiconductor layer 603_a; thus, the oxide semiconductor layer can be highly purified.

Further, in addition to the heat treatment, after the insulating layer 602_a is formed, heat treatment (preferably at higher than or equal to 200° C. and lower than or equal to 600° C., for example, at higher than or equal to 250° C. and lower than or equal to 350° C.) may be performed in an inert gas atmosphere or an oxygen gas atmosphere.

The temperature of the intentional heating of the element formation layer 600_a or the temperature of the heat treatment after the film formation is 150° C. or higher, preferably 200° C. or higher, more preferably 400° C. or higher. When the heat treatment after the formation of the oxide semiconductor film is performed at 300° C. or higher, impurities such as hydrogen contained in the film can be released, resulting in a removal of the impurities (dehydration or dehydrogenation).

The heat treatment can be performed in an oxygen atmosphere; alternatively, the heat treatment may be performed in two steps in such a manner that first heat treatment for dehydration or dehydrogenation is performed in a nitrogen atmosphere or under reduced pressure, and then second heat treatment is performed in an oxygen atmosphere. The second heat treatment performed in an oxygen atmosphere after dehydration or dehydrogenation allows addition of oxygen to the oxide semiconductor; thus, the heat treatment can be performed more effectively. For the treatment for supplying oxygen, heat treatment may be performed with the insulating layer provided in contact with the oxide semiconductor layer. For example, vacancies due to oxygen deficiency are easily caused in the oxide semiconductor layer or at the interface between the oxide semiconductor layer and a layer in contact with the oxide semiconductor layer; however, when oxygen is excessively contained in the oxide semiconductor by the heat treatment, it is possible to compensate for oxygen deficiency caused constantly, with excess oxygen. The excess oxygen is oxygen existing mainly between lattices. When the concentration of oxygen is set to higher than or equal to $1\times10^{16}/cm^3$ and lower than or equal to $2\times10^{20}/cm^3$, oxygen can be contained in the oxide semiconductor layer without causing crystal distortion or the like even in the case where crystallization is performed, for example.

The heat treatment performed after the formation of the oxide semiconductor film makes it possible to increase the stability against a gate-bias stress of the transistor to be manufactured. Further, the field-effect mobility of the transistor can be improved.

Figure 9E:
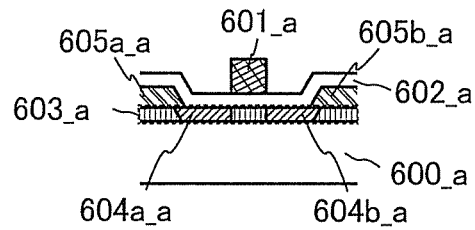

Then, as illustrated in FIG. 9E, a dopant is added to the semiconductor layer 603_a from the side on which the conductive layer 601_a is formed, through the insulating layer 602_a, so that the region 604a_a and the region 604b_a are formed in a self-aligned manner.

For example, the dopant can be added with the use of an ion doping apparatus or an ion implantation apparatus.

Note that although the example of the method for manufacturing the transistor illustrated in FIG. 5A is described, one embodiment of the present invention is not limited thereto. For example, as for the components in FIG. 5B which have the same designations as the components in FIG. 5A and whose functions are at least partly the same as those of the components in FIG. 5A, the description of the example of the method for manufacturing the transistor illustrated in FIG. 5A can be referred to as appropriate.

As described with reference to FIGS. 5A and 5B, FIGS. 6A to 6E, FIGS. 7A to 7C, FIGS. 8A to 8C, and FIGS. 9A to 9E, the transistor exemplified in this embodiment includes a conductive layer functioning as a gate; an insulating layer functioning as a gate insulating layer; an oxide semiconductor layer which overlaps with the conductive layer functioning as the gate with the insulating layer functioning as the gate insulating layer placed therebetween and in which a channel is formed; a conductive layer which is electrically connected to the oxide semiconductor layer and functions as one of a source and a drain; and a conductive layer which is electrically connected to the oxide semiconductor layer and functions as the other of the source and the drain.

Further, in the transistor exemplified in this embodiment, the carrier concentration of the oxide semiconductor layer can be lower than $1\times10^{14}/cm^3$, preferably lower than $1\times10^{12}/cm^3$, more preferably lower than $1\times10^{11}/cm^3$.

When an oxide semiconductor is used for the transistor, the carrier density is preferably $1\times10^{18}/cm^3$ or lower. The carrier density of an oxide semiconductor film containing In or Zn can be set to $1\times10^{18}/cm^3$ or lower when the oxide semiconductor film is not only made to contain Ga or Sn as a component but also highly purified (a removal of hydrogen and the like) and subjected to heat treatment after the film formation.

When heat treatment is performed during and/or after formation of the oxide semiconductor film, the threshold voltage of the transistor can be positively shifted. Further, the transistor can be normally off.

The off-state current per micrometer in channel width can be 10 aA ($1\times10^{-17}$ A) or less, 1 aA ($1\times10^{-18}$ A) or less, 10 zA ($1\times10^{-20}$ A) or less, further 1 zA ($1\times10^{-21}$ A) or less, and furthermore 100 yA ($1\times10^{-22}$ A) or less. When the off-state current of each of the first transistor, the third transistor, and the fourth transistor is as low as the above values, the problem of leakage current of the logic circuit can be solved. Further, the logic circuit can have be dynamically reconfigurable.

It is preferable that the off-state current of the transistor be as low as possible; however, the lower limit of the off-state current of the transistor in this embodiment is estimated at approximately $10^{-30}$ A/μm.

The field-effect mobility of the transistor formed using an oxide semiconductor can be relatively high regardless of whether the oxide semiconductor is amorphous or crystalline. Such an improvement in field-effect mobility is presumed to be achieved not only by a removal of impurities by dehydration or dehydrogenation but also by a reduction in interatomic distance due to an increase in density. The oxide semiconductor film can be crystallized by removing impurities from the oxide semiconductor for the sake of highly purification. For example, the field-effect mobility of an In—Sn—Zn-based oxide semiconductor can be higher than 31 $cm^2/V \cdot s$, preferably higher than 39 $cm^2/V \cdot s$, more preferably higher than 60 $cm^2/V \cdot s$. Further, it is suggested that the field-effect mobility of a highly-purified non-single-crystal oxide semiconductor can be ideally higher than 100 $cm^3/V \cdot s$. It is suggested that the field-effect mobility of the transistor exemplified in this embodiment is higher as the defect density of the oxide semiconductor layer is lower. The reason thereof will be given below.

The actually measured field-effect mobility of a field-effect transistor can be lower than its original field-effect mobility because of a variety of reasons; this phenomenon occurs not only in the case of using a field-effect transistor including an oxide semiconductor layer. One of the reasons that reduce the field-effect mobility is a defect inside a semiconductor layer or a defect at the interface between the semiconductor layer and an insulating layer. When a Levinson model is used, the field-effect mobility on the assumption that no defect exists in an oxide semiconductor layer can be calculated theoretically.

Assuming that the original field-effect mobility and the measured field-effect mobility of a semiconductor layer are $\mu_0$ and $\mu$, respectively, and a potential barrier (such as a grain boundary) exists in the semiconductor layer, the measured field-effect mobility μ can be expressed in Formula 27.

$$\mu = \mu_0 \exp\left(-\frac{E}{kT}\right) \qquad \text{[FORMULA 27]}$$

In Formula 27, E represents the height of the potential barrier, k represents the Boltzmann constant, and T represents the absolute temperature. When the potential barrier is assumed to be attributed to a defect, the height of the potential barrier E can be expressed in Formula 28, according to the Levinson model.

$$E = \frac{e^2 N^2}{8\varepsilon n} = \frac{e^3 N^2 t}{8\varepsilon C_{ox} V_g} \quad \text{[FORMULA 28]}$$

In Formula 28, e represents the elementary charge, N represents the average defect density per unit area in a channel, $\varepsilon$ represents the permittivity of the semiconductor, n represents the surface density of carriers in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed in Formula 29.

$$I_d = \frac{W\mu V_g V_d C_{ox}}{L} \exp\left(-\frac{E}{kT}\right) \quad \text{[FORMULA 29]}$$

In Formula 29, L represents the channel length and W represents the channel width, and L and W are each 10 μm here. In addition, $V_d$ represents the drain voltage. When dividing both sides of the above formula by $V_g$ and then taking logarithms of both sides, Formula 29 can be transformed into Formula 30.

$$\ln\left(\frac{I_d}{V_g}\right) = \ln\left(\frac{W\mu V_d C_{ox}}{L}\right) - \frac{E}{kT} \quad \text{[FORMULA 30]}$$
$$= \ln\left(\frac{W\mu V_d C_{ox}}{L}\right) - \frac{e^3 N^2 t}{8kT\varepsilon C_{ox} V_g}$$

The right side of Formula 30 is a function of $V_g$. From Formula 30, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. For example, the defect density N of an oxide semiconductor film in which the ratio of indium (In), gallium (Ga), and zinc (Zn) is 1:1:1 [atomic ratio] is approximately $1\times10^{12}/\text{cm}^2$.

On the basis of the defect density obtained by the above method, or the like, the original field-effect mobility of a semiconductor layer $\mu_0$ can be calculated to be 120 cm²/V·s from Formula 27 and Formula 28. The field-effect mobility of an In—Ga—Zn-based oxide having a defect is usually approximately 35 cm²/V·s. In contrast, assuming that no defect exists inside a semiconductor layer and at the interface between the semiconductor layer and an insulating film, the mobility $\mu_0$ of the oxide semiconductor is expected to be 120 cm²/V·s. Thus, it can be understood that as the defects are reduced, the mobility of an oxide semiconductor and even the field-effect mobility of a transistor are increased. For example, the defect density of an oxide semiconductor layer such as a CAAC oxide semiconductor layer is low.

Note that even when no defect exists inside a semiconductor layer, scattering at the interface between a channel and a gate insulating layer affects the transport property of the transistor. In other words, the mobility $\mu_1$ at a position that is distance x away from the interface between the channel and the gate insulating layer can be expressed in Formula 31.

$$\frac{1}{\mu_1} = \frac{1}{\mu_0} + \frac{D}{B}\exp\left(-\frac{30}{G}\right) \quad \text{[FORMULA 31]}$$

In Formula 31, D represents the electric field in the gate direction, and B and G are constants. B and G can be obtained from actual measurement results; according to the above measurement results, B is $2.38\times10^7$ cm/s and G is 10 nm (the depth to which the influence of interface scattering reaches). In Formula 31, when D is increased (i.e., when the gate voltage $V_g$ is increased), the second term of Formula 31 is increased and accordingly the mobility $\mu_1$ is decreased.

Figure 10:
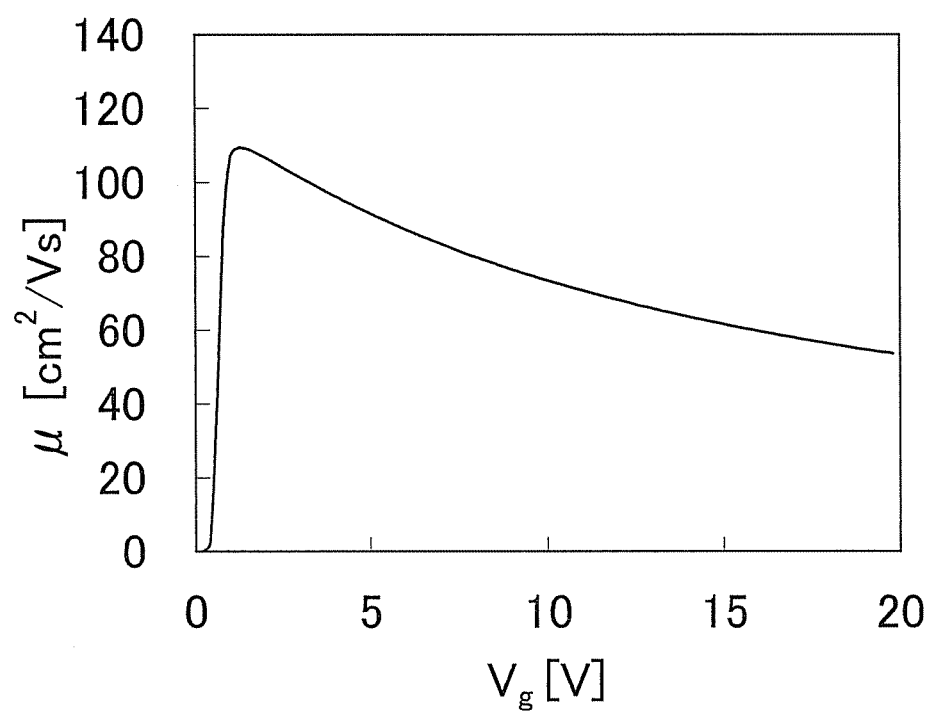
FIG. 10 is a graph showing the relation between defect density of an oxide semiconductor layer and field-effect mobility of a transistor.

Calculation results of the mobility $\mu_2$ of a transistor in which a channel includes an ideal oxide semiconductor layer without a defect inside the semiconductor layer are shown in FIG. 10. For the calculation, device simulation software Sentaurus Device manufactured by Synopsys, Inc. was used. The bandgap, the electron affinity, the relative permittivity, and the thickness of the oxide semiconductor layer were assumed to be 2.8 eV, 4.7 eV, 15, and 15 nm, respectively. Further, the work functions of a gate, a source, and a drain of the transistor were assumed to be 5.5 eV, 4.6 eV, and 4.6 eV, respectively. The thickness of the gate insulating layer is 100 nm, and the relative permittivity thereof is 4.1. The channel length and the channel width of the transistor were each assumed to be 10 μm, and the drain voltage $V_d$ was assumed to be 0.1 V.

As shown in FIG. 10, the field-effect mobility is as high as more than 100 cm²/V·s when the gate voltage $V_g$ is around 1 V and is decreased as the gate voltage $V_g$ becomes higher because the influence of interface scattering is increased. Note that in order to reduce interface scattering, it is preferable that a surface of the semiconductor layer be flat at the atomic level (also referred to as atomic layer flatness).

In addition, calculation results of electric characteristics of minute transistors which are manufactured using an oxide semiconductor layer having such a high field-effect mobility will be described below.

Figure 11A:
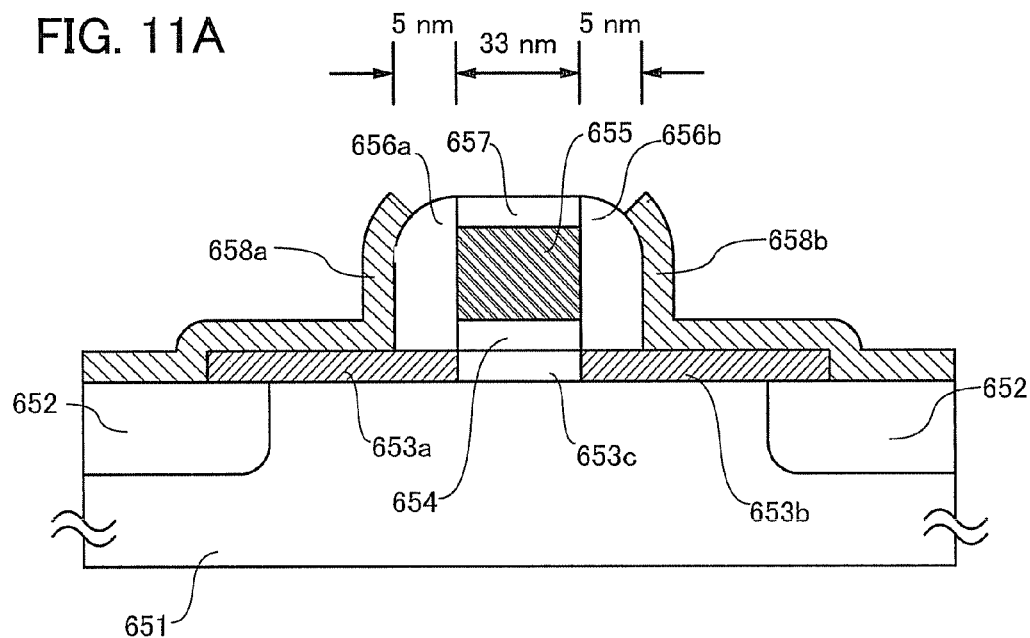
FIGS. 11A and 11B are diagrams each illustrating a structure of a transistor.
Figure 11B:
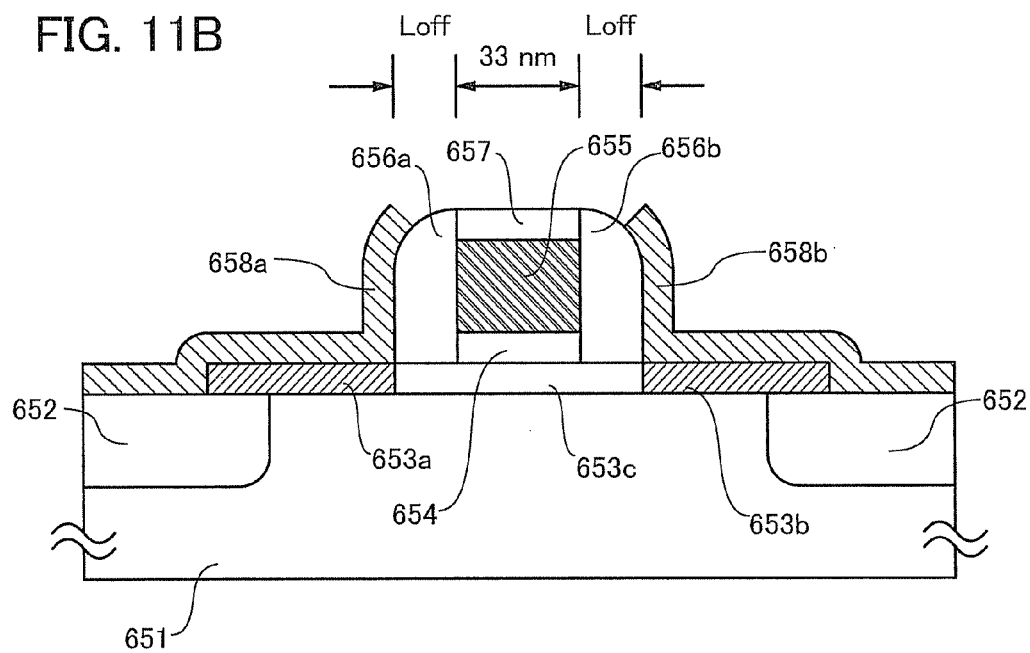

First, FIGS. 11A and 11B illustrate cross-sectional structures of the transistors used for the calculation. The transistors illustrated in FIGS. 11A and 11B each include a semiconductor region 653a and a semiconductor region 653b which have n-type conductivity in an oxide semiconductor layer. The resistivities of the semiconductor region 653a and the semiconductor region 653b are $2\times10^{-3}$ Ωcm.

The transistor in FIG. 11A is provided over a base insulator 651 provided with an embedded insulator 652. The embedded insulator 652 is formed using aluminum oxide so as to be embedded in the base insulator 651.

Further, the transistor in FIG. 11A includes the semiconductor region 653a, the semiconductor region 653b, the semiconductor region 653c, a gate insulating layer 654, a gate electrode 655, a sidewall insulator 656a, a sidewall insulator 656b, an insulator 657, a source electrode 658a, and a drain electrode 658b.

The semiconductor region 653c is provided between the semiconductor region 653a and the semiconductor region 653b. The semiconductor region 653c is an intrinsic semiconductor region serving as a channel formation region.

The gate electrode 655 is provided over the gate insulating layer 654. Note that the width of the gate electrode 655 is 33 nm.

The sidewall insulator 656a and the sidewall insulator 656b are provided in contact with side surfaces of the gate electrode 655. In the transistor in FIG. 11A, the semiconductor regions under the sidewall insulator 656a and the sidewall insulator 656b are part of the semiconductor region 653a having n-type conductivity and part of the semiconductor region 653b having n-type conductivity, respectively. Note that the widths of the sidewall insulator 656a and the sidewall insulator 656b are each 5 nm.

The insulating layer 657 is provided over the gate electrode 655. The insulating layer 657 has a function of preventing a short circuit between the gate electrode 655 and another wiring.

The source electrode 658a is in contact with the semiconductor region 653a.

The drain electrode 658b is in contact with the semiconductor region 653b.

Note that the channel width of the transistor in FIG. 11A is 40 nm.

The transistor illustrated in FIG. 11B is different from the transistor illustrated in FIG. 11A in the conductivity type of semiconductor regions under the sidewall insulator 656a and the sidewall insulator 656b. In the transistor in FIG. 11B, the semiconductor regions under the sidewall insulator 656a and the sidewall insulator 656b are part of the intrinsic semiconductor region 653c. In other words, in the transistor in FIG. 11B, a region where the semiconductor region 653a does not overlap with the gate electrode 655 and a region where the semiconductor region 653b does not overlap with the gate electrode 655 are provided. These regions are called offset regions, and the widths thereof are called offset lengths (also referred to as $L_{off}$). In FIG. 11B, the offset length is equal to the width of each of the sidewall insulator 656a and the sidewall insulator 656b.

The other parameters used in calculation are as described above. For the calculation, device simulation software Sentaurus Device manufactured by Synopsys, Inc. was used.

Figure 12A:
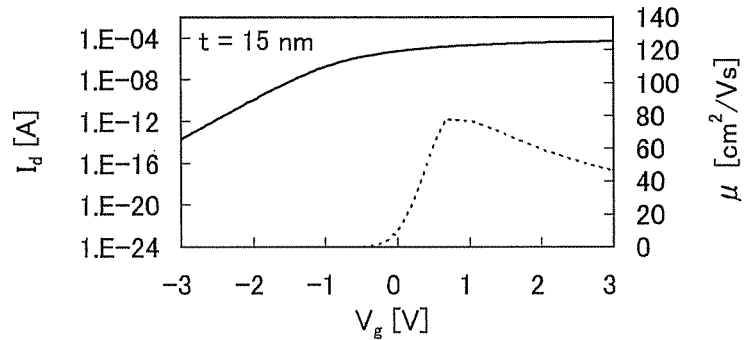
FIGS. 12A to 12C are graphs each showing calculation results of electric characteristics of a transistor.
Figure 12B:
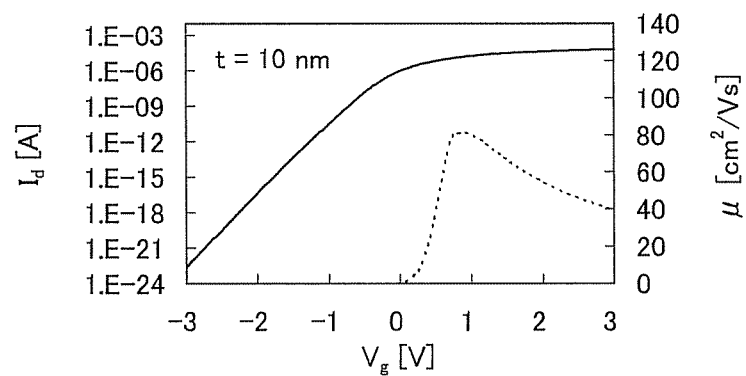
Figure 12C:
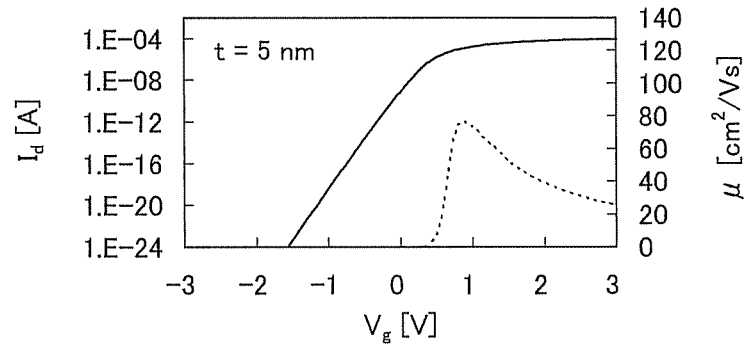

FIGS. 12A to 12C show the gate voltage ($V_g$: a potential difference between the gate and the source) dependence of the drain current ($I_d$, solid line) and the field-effect mobility ($\mu$, dotted line) of the transistor having the structure illustrated in FIG. 11A. The drain current $I_d$ is obtained by calculation under the assumption that the drain voltage (a potential difference between the drain and the source) is +1 V and the mobility $\mu$ is obtained by calculation under the assumption that the drain voltage is +0.1 V.

FIG. 12A shows the case of the transistor in which the thickness of the gate insulating layer 654 is 15 nm, FIG. 12B shows the case of the transistor in which the thickness of the gate insulating layer 654 is 10 nm, and FIG. 12C shows the case of the transistor in which the thickness of the gate insulating layer 654 is 5 nm. As shown in FIGS. 12A to 12C, as the gate insulating layer 654 is thinner, the drain current $I_d$ (off-state current) particularly in an off state is significantly decreased. In contrast, there is no noticeable change in the peak value of the field-effect mobility $\mu$ and the drain current $I_d$ in an on state (on-state current). Further, the drain current exceeds 10 $\mu$A at a gate voltage of around 1 V.

Figure 13A:
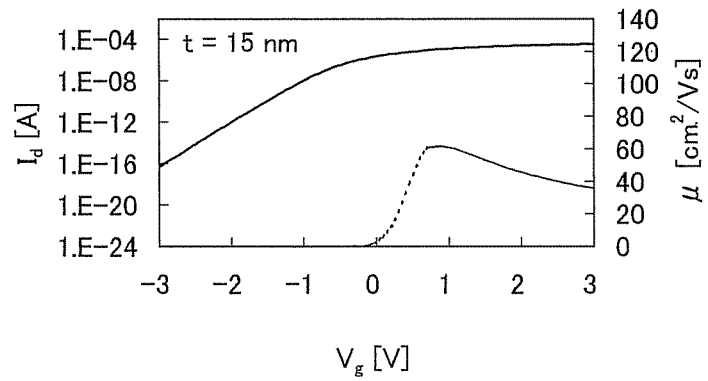
FIGS. 13A to 13C are graphs each showing calculation results of electric characteristics of a transistor.
Figure 13B:
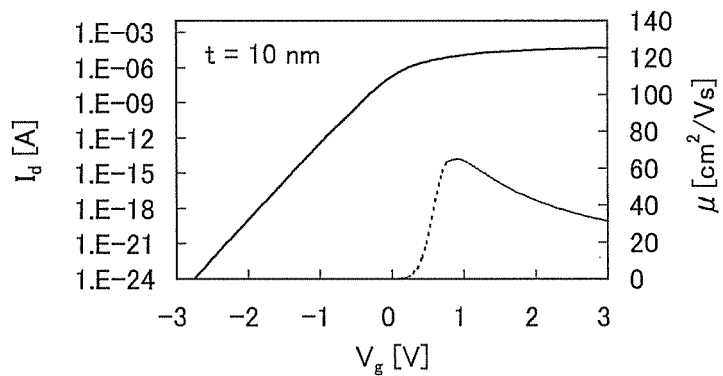
Figure 13C:
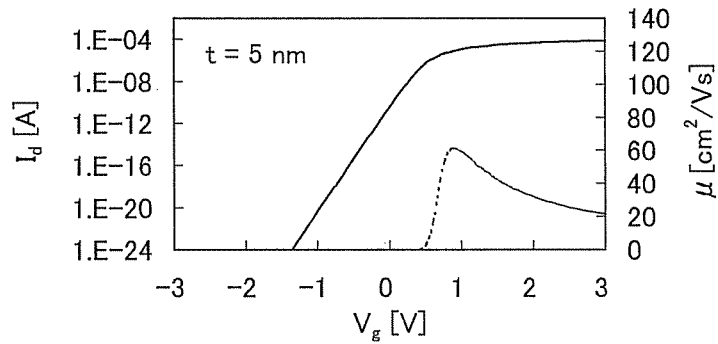

FIGS. 13A to 13C show the gate voltage $V_g$ dependence of the drain current $I_d$ (solid line) and the field-effect mobility $\mu$ (dotted line) of the transistor having the structure in FIG. 11B in which the offset length ($L_{off}$) of 5 nm. Here, the drain current $I_d$ is calculated under the assumption that the drain voltage is +1 V and the field-effect mobility $\mu$ is calculated under the assumption that the drain voltage is +0.1 V. FIG. 13A shows the case where the thickness of the gate insulating layer 654 is 15 nm, FIG. 13B shows the case where the thickness of the gate insulating layer 654 is 10 nm, and FIG. 13C shows the case where the thickness of the gate insulating layer 654 is 5 nm.

Figure 14A:
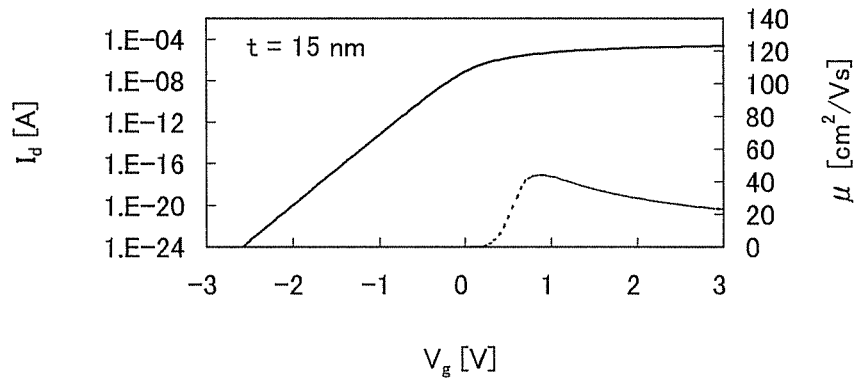
FIGS. 14A to 14C are graphs each showing calculation results of electric characteristics of a transistor.
Figure 14B:
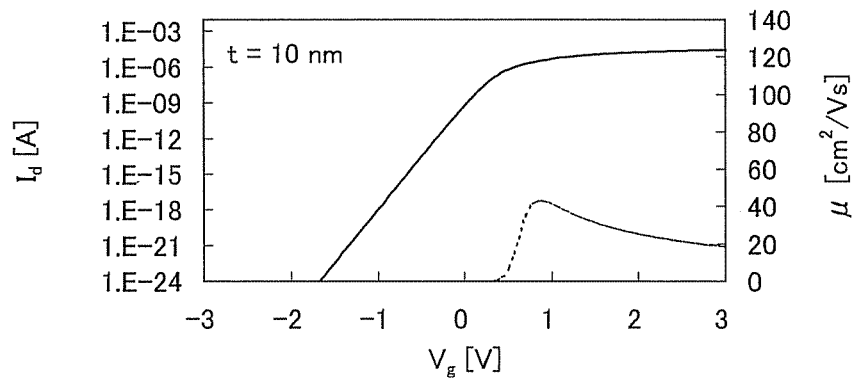
Figure 14C:
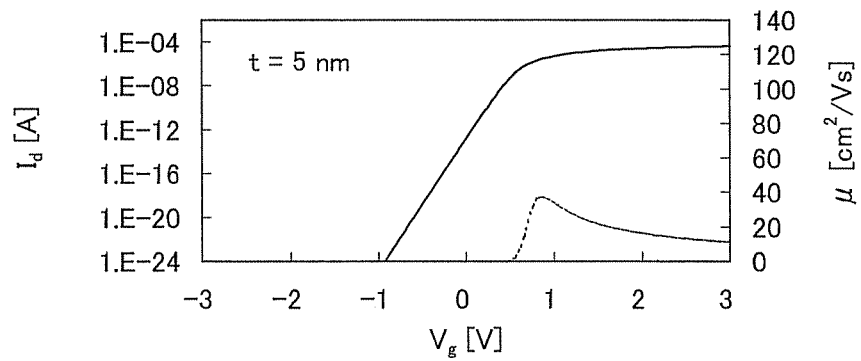

FIGS. 14A to 14C show the gate voltage dependence of the drain current $I_d$ (solid line) and the mobility $\mu$ (dotted line) of the transistor having the structure in FIG. 11B in which the offset length $L_{off}$ is 15 nm. Here, the drain current $I_d$ is obtained by calculation under the assumption that the drain voltage is +1 V and the field-effect mobility $\mu$ is obtained by calculation under the assumption that the drain voltage is +0.1 V. FIG. 14A shows the case where the thickness of the gate insulating layer 654 is 15 nm, FIG. 14B shows the case where the thickness of the gate insulating layer 654 is 10 nm, and FIG. 14C shows the case where the thickness of the gate insulating layer 654 is 5 nm.

FIGS. 12A to 12C, FIGS. 13A to 13C, and FIGS. 14A to 14C show that in any of the structures, as the gate insulating layer 654 is thinner, the off-state current of the transistor is significantly decreased, whereas no remarkable change occurs in the peak value of the field-effect mobility $\mu$ and the on-state current of the transistor.

Note that the peak of the field-effect mobility $\mu$ is approximately 80 cm²/V·s in FIGS. 12A to 12C, approximately 60 cm²/V·s in FIGS. 13A to 13C, and approximately 40 cm²/V·s in FIGS. 14A to 14C; thus, the peak of the field-effect mobility $\mu$ is decreased as the offset length ($L_{off}$) is increased. Further, the same applies to the off-state current of the transistor. The on-state current of the transistor is also decreased as the offset length ($L_{off}$) is increased; however, the decrease in the on-state current of the transistor is much more gradual than the decrease in the off-state current of the transistor. In any of the transistors, the drain current exceeds 10 $\mu$A at a gate voltage of around 1 V.

The transistor exemplified in this embodiment and another transistor (e.g., a transistor including a semiconductor layer containing a semiconductor that belongs to Group 14 in the periodic table (e.g., silicon)) can be stacked. Thus, it is possible to form both the transistor including an oxide semiconductor layer and the another transistor over one substrate while achieving a reduction in circuit area. Further, the field-effect mobility of the transistor including an oxide semiconductor layer can be increased, leading to operation without any trouble of the logic circuit according to the above embodiment.

When the transistor including an oxide semiconductor layer according to this embodiment is applied to the first transistor, or the third transistor and the fourth transistor in the logic circuit according to the above embodiment, data in the logic circuit can be held reliably.

Further, examples of transistors each including an oxide semiconductor layer containing In, Sn, and Zn as a channel formation layer will be described as the transistor exemplified above.

Figure 15A:
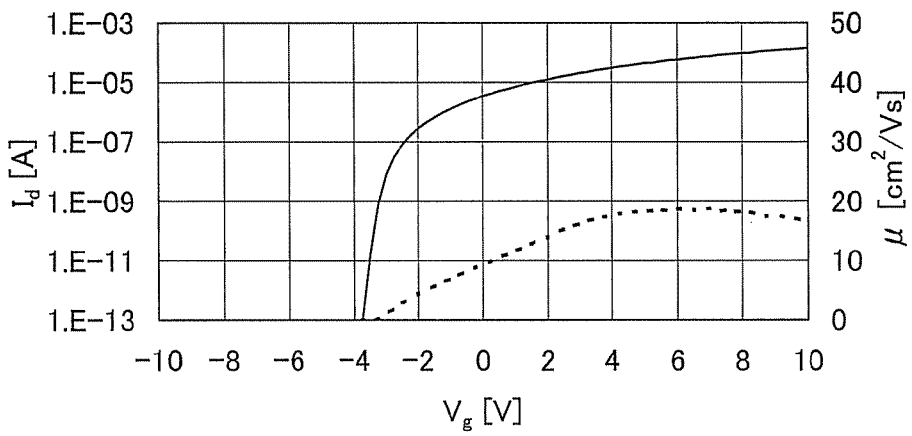
FIGS. 15A to 15C are graphs each showing calculation results of electric characteristics of a transistor.
Figure 15B:
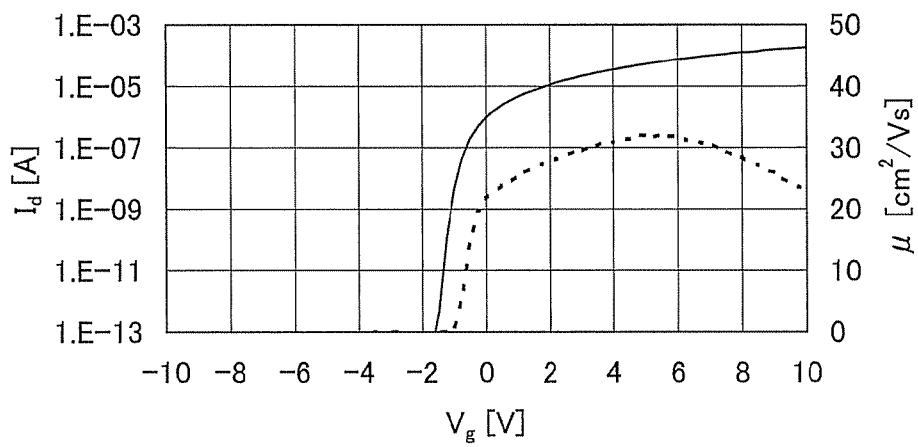
Figure 15C:
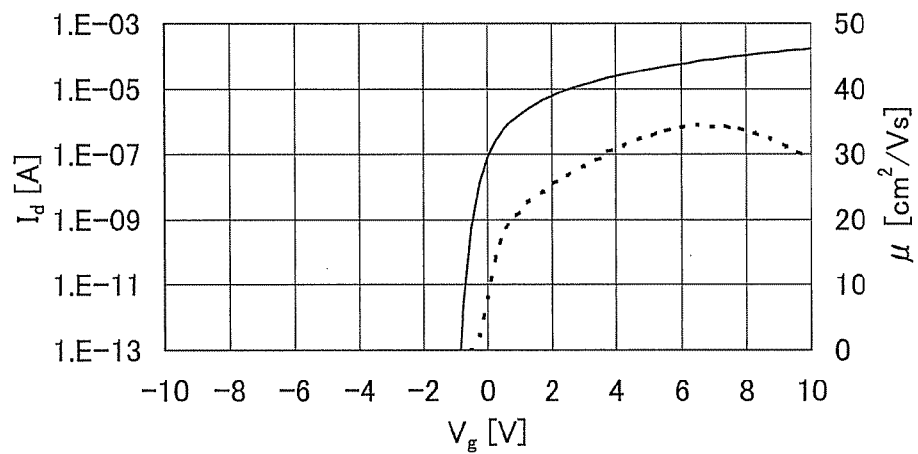

For example, FIGS. 15A to 15C each show characteristics of a transistor that includes an oxide semiconductor layer including In, Sn, and Zn as main components and having a channel length L of 3 $\mu$m and a channel width W of 10 $\mu$m, and a gate insulating layer with a thickness of 100 nm. Note that $V_d$ is 10 V.

FIG. 15A shows characteristics of a transistor whose oxide semiconductor layer was formed in such a manner that an oxide semiconductor film containing In, Sn, and Zn as main components was formed by a sputtering method without heating an element formation layer intentionally and then was etched. In FIG. 15A, the field-effect mobility is 18.8 cm²/V·s. FIG. 15B shows characteristics of a transistor whose oxide semiconductor layer was formed in such a manner that an oxide semiconductor film containing In, Sn, and Zn as main components was formed after heating a substrate at 200° C. and then was etched. In FIG. 15B, the field-effect mobility is 32.2 cm²/V·s. These results suggest that intentional heating improved the field-effect mobility of the transistor.

FIG. 15C shows characteristics of a transistor whose oxide semiconductor layer was subjected to heat treatment at 650° C. after being formed in such a manner that an oxide semiconductor film containing In, Sn, and Zn as main components was formed at 200° C. by a sputtering method and then was etched. In FIG. 15C, the field-effect mobility is 34.5 cm$^2$/V·s. This result suggests that heat treatment performed after the formation of the oxide semiconductor film improved the field-effect mobility.

Note that oxygen ions may be implanted into the oxide semiconductor layer containing In, Sn, and Zn as main components, an impurity such as hydrogen, water, a hydroxyl group, or hydride contained in the oxide semiconductor layer may be released by heat treatment, and the oxide semiconductor layer may be crystallized through the heat treatment or by another heat treatment performed later. By such crystallization treatment or recrystallization treatment, a non-single-crystal oxide semiconductor layer having favorable crystallinity can be obtained.

In the transistor including an oxide semiconductor layer containing In, Sn, and Zn as main components, which was formed without heating the element formation layer intentionally, the threshold voltage tends to be negatively shifted as shown in FIG. 15A, for example. In contrast, when the oxide semiconductor layer formed while intentionally heating the element formation layer is used, the threshold voltage is positively shifted relatively as shown in FIG. 15B. Therefore, there is a possibility that a transistor can be normally off by heat treatment during and/or after formation of an oxide semiconductor film.

Note that the threshold voltage of a transistor can also be controlled by changing the ratio of In, Sn, and Zn. For example, when the composition ratio of In, Sn, and Zn is 2:1:3, a normally-off transistor can be easily formed.

Such an oxide semiconductor film can be used for the first transistor, the third transistor, or the fourth transistor.

Further, for example, when a gate bias-temperature stress test (also referred to as a BT test) is performed with an electric field intensity of 2 MV/cm at 150° C. for one hour, drift of the threshold voltage is less than ±1.5 V, preferably less than ±1.0 V. Thus, it is understood that heat treatment during and/or after formation of an oxide semiconductor film increases the stability against a gate-bias stress. FIGS. 16A and 16B and FIGS. 17A and 17B show results of BT tests performed on the following two transistors: Sample 1 on which heat treatment was not performed after formation of an oxide semiconductor film, and Sample 2 on which heat treatment at 650° C. was performed after formation of an oxide semiconductor film. Note that as the BT test, a positive BT test and a negative BT test were performed.

In the positive BT test, first, the $V_g$-$I_d$ characteristics of the transistors were measured under the condition that the temperature of the element formation layer (substrate) was 25° C. and $V_d$ was 10 V. Then, the temperature of the element formation layer (substrate) was set to 150° C. and $V_d$ was set to 0.1 V. After that, $V_g$ of 20 V was applied so that the intensity of an electric field applied to gate insulating layers was 2 MV/cm, and the condition was kept for one hour. Next, $V_g$ was set to 0 V and the $V_g$-$I_d$ characteristics of the transistors were measured under the condition that the temperature of the element formation layer (substrate) was 25° C. and $V_d$ was 10 V.

In the negative BT test, first, $V_g$-$I_d$ characteristics of the transistors were measured under the condition that the temperature of the element formation layer (substrate) was 25° C. and $V_d$ was 10 V. Then, the temperature of the element formation layer (substrate) was set to 150° C. and $V_d$ was set to 0.1 V. After that, $V_g$ of −20 V was applied so that the intensity of an electric field applied to gate insulating layers was −2 MV/cm, and the condition was kept for one hour. Next, $V_g$ was set to 0 V and the $V_g$-$I_d$ characteristics of the transistors were measured under the condition that the temperature of the element formation layer (substrate) was 25° C. and $V_d$ was 10 V.

Figure 16A:
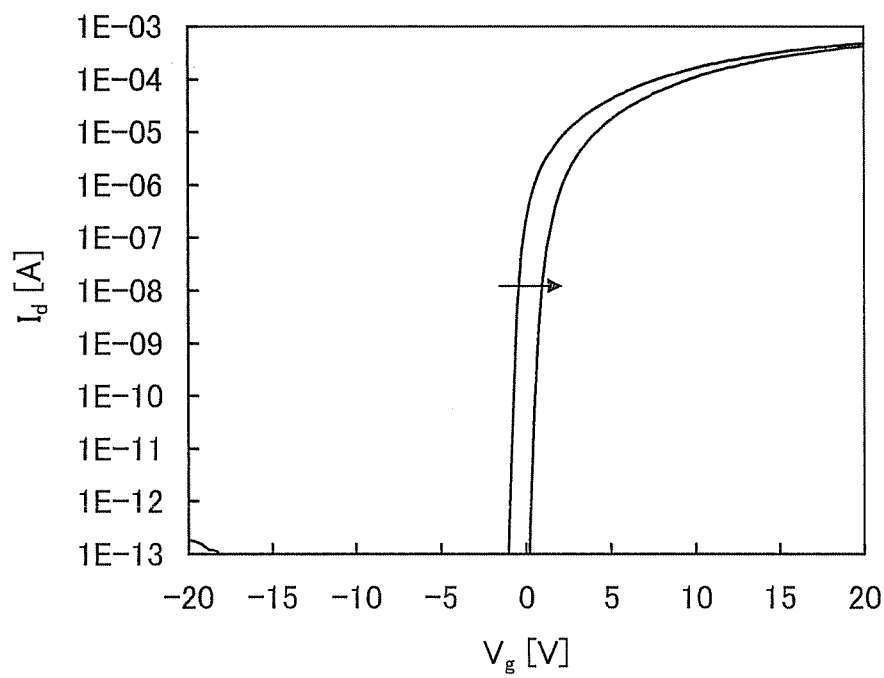
FIGS. 16A and 16B are graphs each showing calculation results of electric characteristics of a transistor.
Figure 16B:
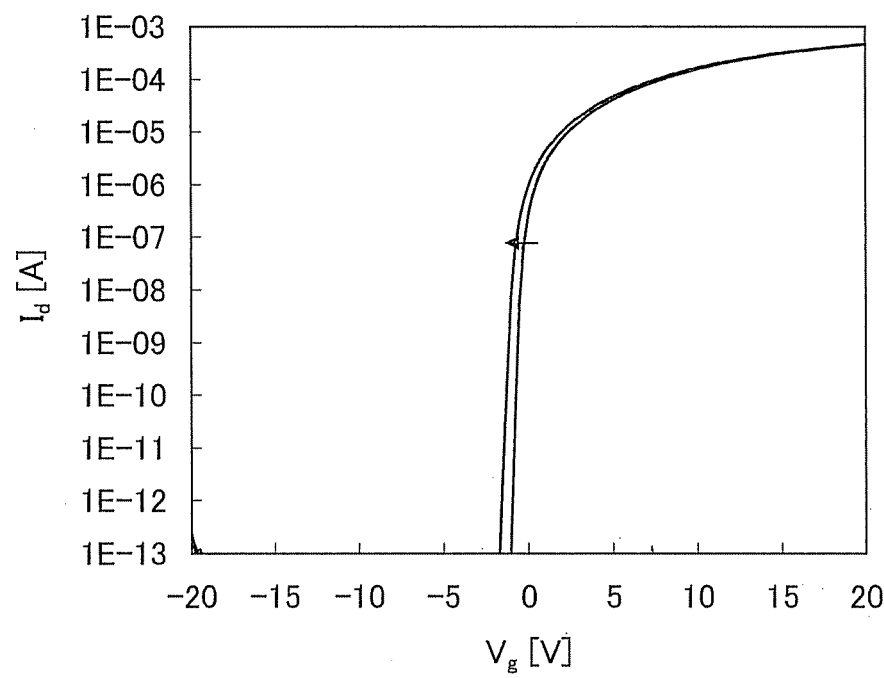
Figure 17A:
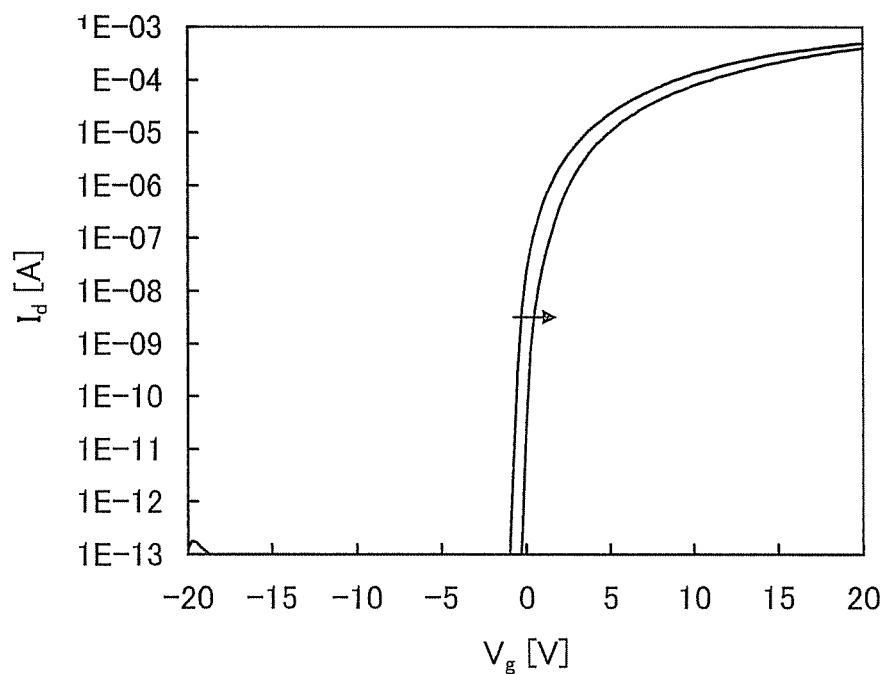
FIGS. 17A and 17B are graphs each showing calculation results of electric characteristics of a transistor.
Figure 17B:
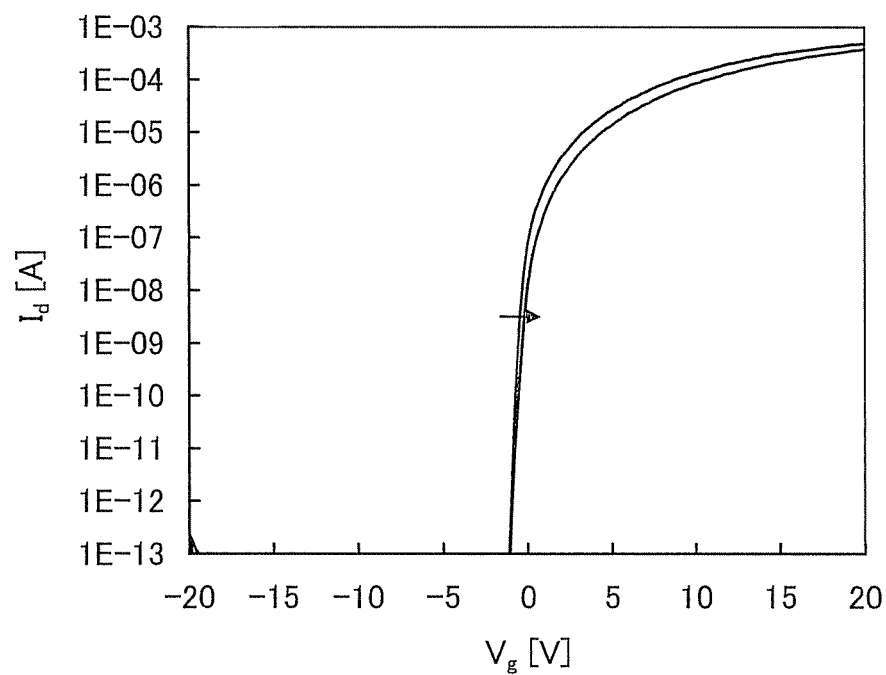

FIGS. 16A and 16B show a result of the positive BT test of Sample 1 and a result of the negative BT test of Sample 1, respectively. FIGS. 17A and 17B show a result of the positive BT test of Sample 2 and a result of the negative BT test of Sample 2, respectively.

As shown in FIGS. 16A and 16B, the amount of shift in the threshold voltage of the transistor of Sample 1 due to the positive BT test and that due to the negative BT test were 1.80 V and −0.42 V, respectively. As shown in FIGS. 17A and 17B, the amount of shift in the threshold voltage of the transistor of Sample 2 due to the positive BT test and that due to the negative BT test were 0.79 V and 0.76 V, respectively. Thus, it is found that, in each of the transistors of Sample 1 and Sample 2, the amount of shift in the threshold voltage between before and after the BT tests is small and the reliability is high.

When an oxide semiconductor film which is formed by a sputtering method using a metal oxide target having a composition ratio of In:Sn:Zn=1:1:1 without heating an element formation layer intentionally is analyzed by X-ray diffraction (XRD), a halo pattern is observed. However, the oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

Here, results of an XRD analysis of In—Sn—Zn—O films will be described below. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. Methods for forming Sample A and Sample B will be described below.

An In—Sn—Zn—O film with a thickness of 100 nm was formed over a quartz substrate subjected to dehydrogenation treatment. The In—Sn—Zn—O film was formed with a sputtering apparatus with a power of 100 W (DC) in an oxygen atmosphere. An In—Sn—Zn—O target with an atomic ratio of In:Sn:Zn=1:1:1 was used as a target. Note that the heating temperature in film formation was set to 200° C. A sample formed through the above steps was used as Sample A.

Next, a sample manufactured by a method similar to that of Sample A was subjected to heat treatment at 650° C. Here, heat treatment in a nitrogen atmosphere was first performed for one hour and heat treatment in an oxygen atmosphere was further performed for one hour without lowering the temperature. A sample formed through the above steps was used as Sample B.

Figure 18:
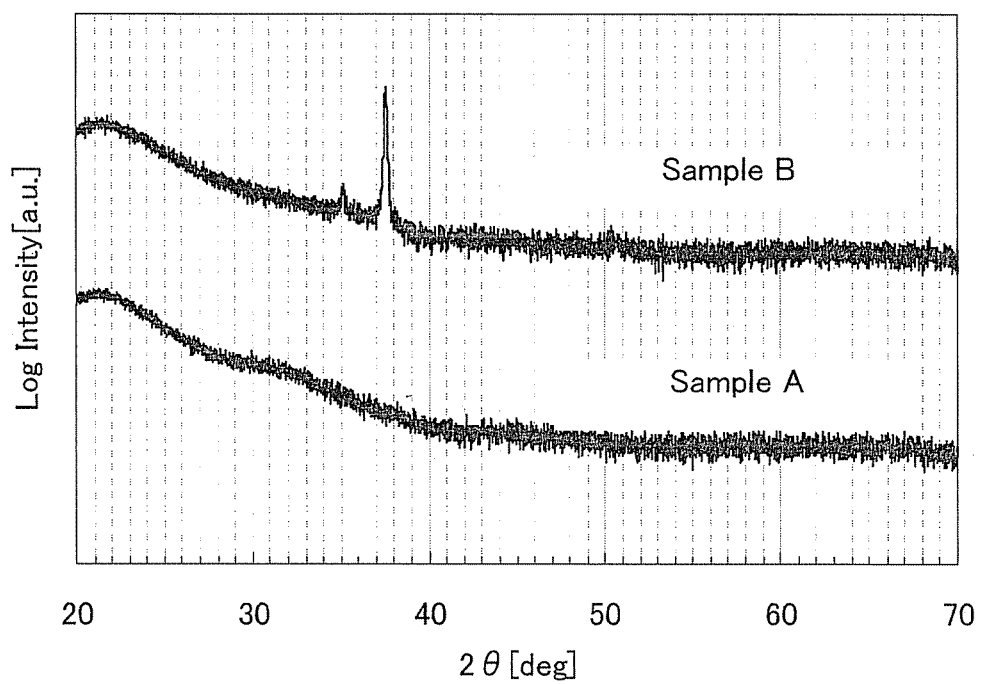
FIG. 18 is a graph showing XRD measurement results of transistors.

FIG. 18 shows XRD spectra of Sample A and Sample B. No peak derived from crystal was observed in Sample A, whereas peaks derived from crystal were observed when 2θ was around 35 deg. and at 37 deg. to 38 deg. in Sample B. Thus, it is found that heat treatment during and/or after formation of an oxide semiconductor film containing In, Sn, and Zn as main components improves crystallinity of an oxide semiconductor layer.

Figure 19:
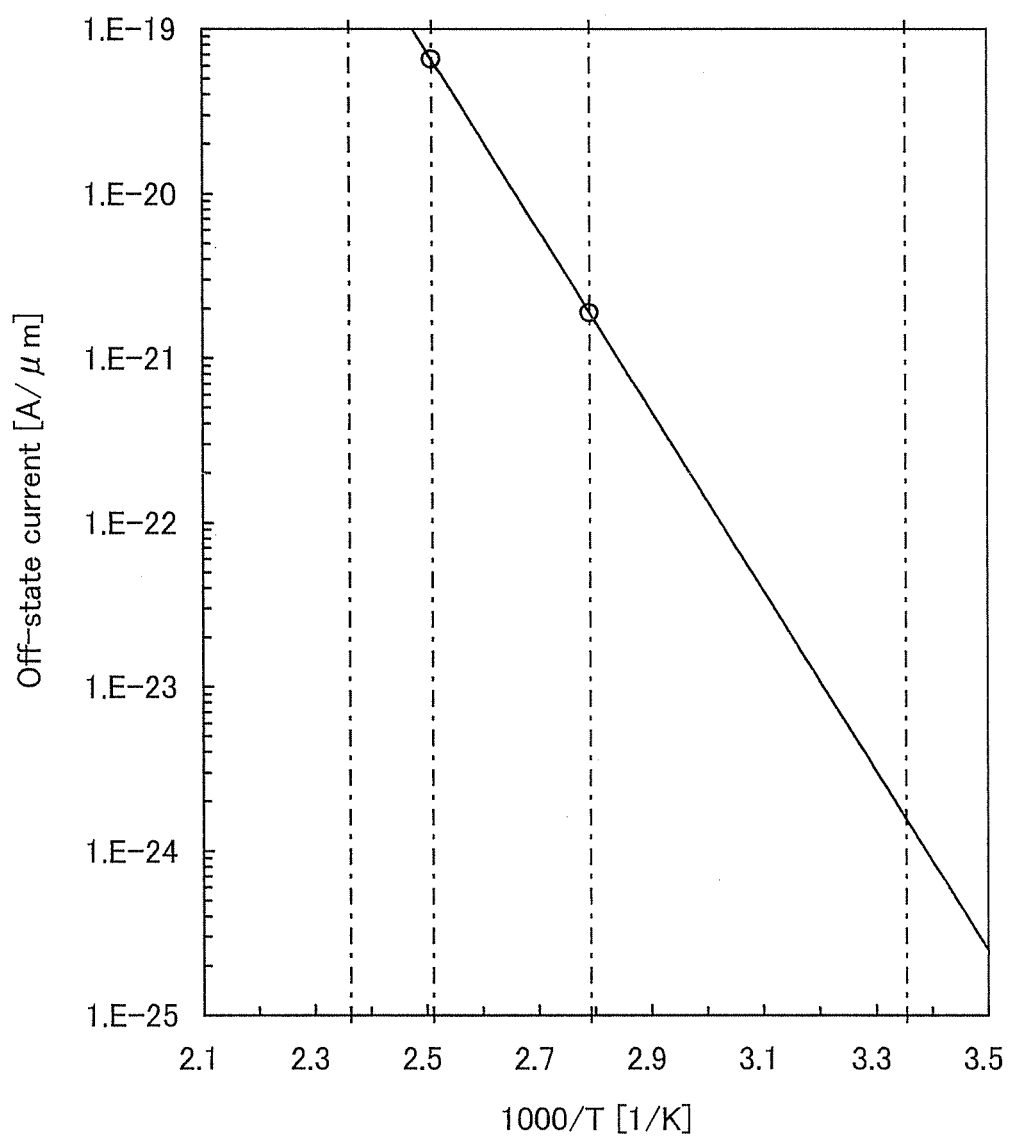
FIG. 19 is a graph showing characteristics of a transistor.

For example, as shown in FIG. 19, the off-state current per micrometer in channel width of the transistor formed with heat treatment during and/or after formation of the oxide semiconductor film was 0.1 aA/μm ($1\times10^{19}$ A/μm) or smaller and 10 zA/μm ($1\times10^{-20}$ A/μm) or smaller when the substrate temperature (the temperature of the element formation layer) was 125° C. and 85° C., respectively. The proportional relation between the logarithm of the off-state current and the inverse of the temperature suggests that the off-state current at room temperature (27° C.) is 0.1 zA/μm ($1\times10^{-22}$ A/μm) or smaller. Hence, the off-state current can be 1 aA/μm ($1\times10^{-18}$ A/μm) or smaller, 100 zA/μm ($1\times10^{-19}$ A/mm) or smaller, and 1 zA/μm ($1\times10^{-21}$ A/μm) or smaller at 125° C., 85° C., and room temperature, respectively.

When the off-state current of each of the first transistor, the third, transistor, and the fourth transistor falls within the above range, the problem of leakage current of the logic circuit can be solved. Further, the logic circuit can be dynamically reconfigurable.

Although it is possible to remove hydrogen from an oxide semiconductor film containing In, Sn, and Zn as main components by heat treatment, a film which does not contain any impurity originally is preferably formed because moisture is released from the oxide semiconductor film containing In, Sn, and Zn as main components at a higher temperature than from an oxide semiconductor film containing In, Ga, and Zn as main components.

The relation between the temperature of the element formation layer (substrate) and electric characteristics of the transistor of Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. The evaluation was performed under six conditions: the temperature of the element formation layer (substrate) was −40° C., −25° C., 25° C., 75° C., 125° C., and 150° C. Note that Lov refers to the width of a portion where a gate electrode overlaps with one of a pair of electrodes, and dW refers to the width of a portion of the pair of electrodes, which does not overlap with an oxide semiconductor film.

Figure 20:
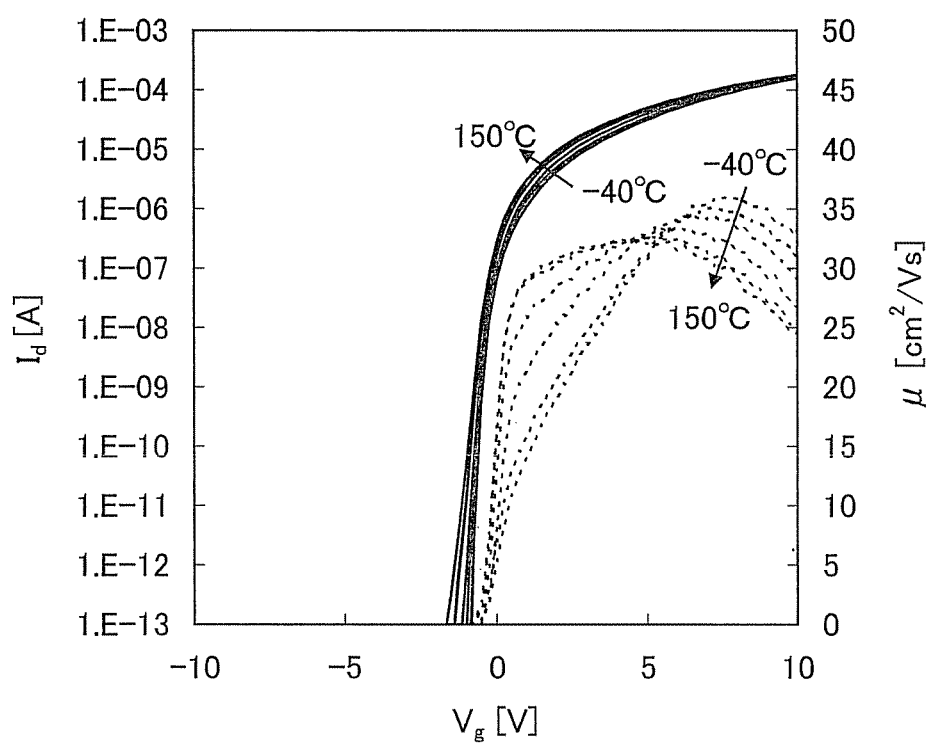
FIG. 20 is a graph showing characteristics of transistors.
Figure 21A:
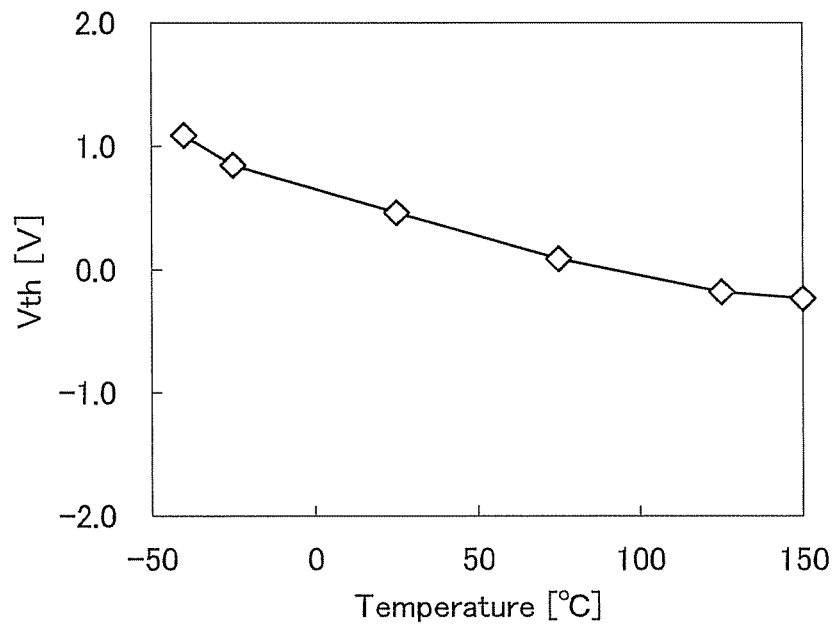
FIGS. 21A and 21B are graphs each showing characteristics of a transistor.

FIG. 20 shows the $V_g$ dependence of $I_d$ (solid line) and field-effect mobility (dotted line). FIG. 21A shows the relation between the temperature of the element formation layer (substrate) and the threshold voltage, and FIG. 21B shows the relation between the temperature of the element formation layer (substrate) and the field-effect mobility.

From FIG. 20 and FIG. 21A, it is found that the threshold voltage gets lower as the temperature of the element formation layer (substrate) increases. Note that the threshold voltage is decreased from 1.09 V to −0.23 V in the range from −40° C. to 150° C.

Figure 21B:
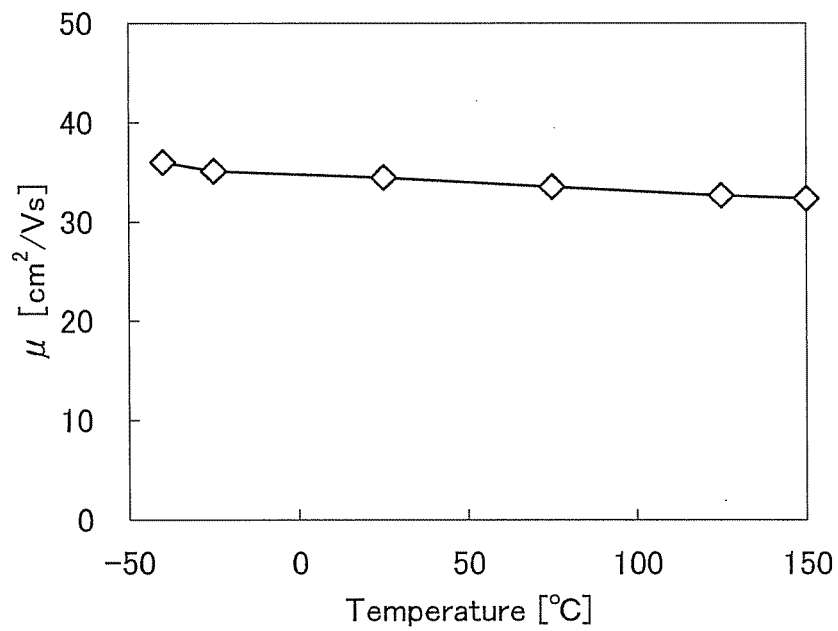

From FIG. 20 and FIG. 21B, it is found that the field-effect mobility gets lower as the temperature of the element formation layer (substrate) increases. Note that the mobility is decreased from 36 cm$^2$/V·s to 32 cm$^2$/V·s in the range from −40° C. to 150° C. Thus, it is found that variation in electric characteristics is small in the above temperature range.

The above is description of the transistors including oxide semiconductor layers containing In, Sn, and Zn.

In the transistor including the oxide semiconductor layer containing In, Sn, and Zn as main components, a field-effect mobility of 30 cm$^2$/V·s or higher, preferably 40 cm$^2$/V·s or higher, more preferably 60 cm$^2$/V·s or higher can be obtained with the off-state current maintained at 1 aA/μm or lower (per micrometer in channel width), which makes it possible to achieve on-state current needed for an LSI. For example, in a transistor where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. When such characteristics are ensured, the transistor including the oxide semiconductor layer can be applied to the first transistor, the third transistor, and the fourth transistor, and a transistor including a semiconductor layer containing a semiconductor belonging to Group 14 of the periodic table can be applied to the second transistor. That is to say, a logic circuit having a novel property of, for example, being dynamically reconfigurable can be provided without decreasing the operation speed even when the transistor including the oxide semiconductor layer is also provided in a circuit including a transistor including a semiconductor layer containing a semiconductor belonging to Group 14 of the periodic table (e.g., silicon).

Embodiment 6

In this embodiment, description will be given of an example of a CPU (arithmetic processing unit) provided with the logic circuits according to one embodiment of the present invention.

An example of the arithmetic processing unit in this embodiment will be described with reference to FIG. 22.

Figure 22:
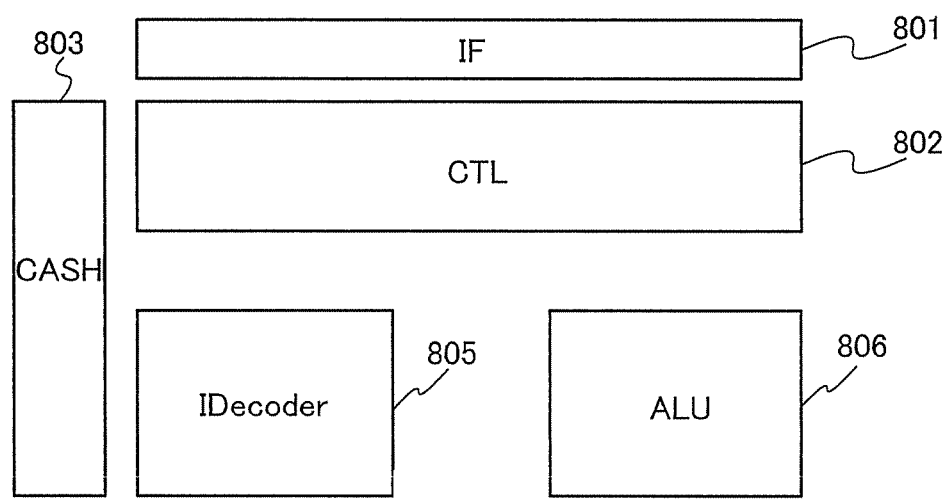
FIG. 22 is a diagram illustrating an arithmetic processing unit including a logic circuit according to one embodiment of the present invention.

The arithmetic processing unit illustrated in FIG. 22 includes a bus interface (also referred to as an IF) 801, a control unit (also referred to as a CTL) 802, a cache memory (also referred to as a CACH) 803, an instruction decoder (also referred to as an IDecoder) 805, and an arithmetic logic unit (also referred to as an ALU) 806.

The bus interface 801 has a function of transmitting and receiving signals to and from the outside of the arithmetic processing unit and a function of transmitting and receiving signals to and from circuits in the arithmetic processing unit, for example.

The control unit 802 has a function of controlling operations of the circuits in the arithmetic processing unit.

For example, the control unit 802 can be formed using the logic circuit according to the above embodiment.

The cache memory 803 is controlled by the control unit 802 and has a function of temporarily storing data at the time of operation of the arithmetic processing unit. Note that the arithmetic processing unit may include a plurality of cache memories 803 as a first cache and a second cache, for example.

The instruction decoder 805 has a function of translating a read command signal. The translated command signal is input to the control unit 802, and the control unit 802 outputs a control signal in accordance with the command signal to the arithmetic logic unit 806.

For example, the instruction decoder 805 can be formed using the logic circuit according to the above embodiment.

The arithmetic logic unit 806 is controlled by the control unit 802 and has a function of performing logic operation in accordance with the input command signal.

For example, the arithmetic logic unit 806 can be formed using the logic circuit according to the above embodiment.

Note that the arithmetic processing unit may be provided with a register. When the arithmetic processing unit is provided with a register, the register is controlled by the control unit 802. For example, the arithmetic processing unit may be provided with a plurality of registers one of which is used as a register for the arithmetic logic unit 806 and another of which is used as a register for the instruction decoder 805.

As described with reference to FIG. 22, in one example of the arithmetic processing unit according to this embodiment, the use of the logic circuit according to the above embodiment for each of units such as the control unit, the instruction decoder, and the arithmetic logic unit allows retention of data and an increase in processing speed in the units.

Embodiment 7

In this embodiment, examples of electronic devices each provided with the logic circuit according to any of the above embodiments will be described.

Structural examples of the electronic devices according to this embodiment will be described with reference to FIGS. 23A to 23D.

Figure 23A:
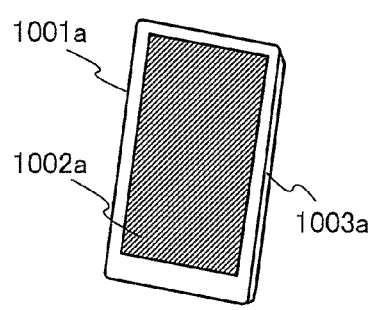
FIGS. 23A to 23D show electronic devices each including a logic circuit according to one embodiment of the present invention.

An electronic device in FIG. 23A is an example of a portable information terminal. The portable information terminal in FIG. 23A includes a housing 1001a and a display portion 1002a provided in the housing 1001a.

Note that a side surface 1003a of the housing 1001a may be provided with a connection terminal for connecting the portable information terminal in FIG. 23A to an external device and/or a button used to operate the portable information terminal.

In the housing 1001a of the portable information terminal illustrated in FIG. 23A, a CPU, a memory circuit, an interface with which signals are transmitted and received between the external device and each of the CPU and the memory circuit, and an antenna which transmits and receives signals to/from the external device are provided.

The portable information terminal illustrated in FIG. 23A has a function of one or more of a telephone set, an electronic book, a personal computer, and a game machine.

Figure 23C:
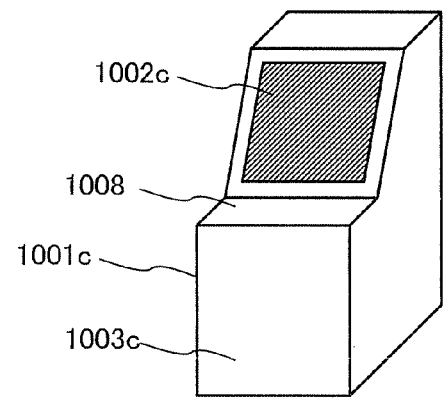
Figure 23B:
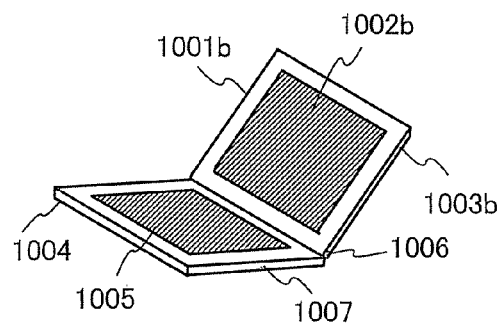

An electronic device in FIG. 23B is an example of a folding portable information terminal. The portable information terminal illustrated in FIG. 23B includes a housing 1001b, a display portion 1002b provided in the housing 1001b, a housing 1004, a display portion 1005 provided in the housing 1004, and a hinge 1006 for connecting the housing 1001b and the housing 1004.

In the portable information terminal in FIG. 23B, the housing 1001b can be stacked on the housing 1004 by moving the housing 1001b or the housing 1004 with the hinge 1006.

Note that a side surface 1003b of the housing 1001b or a side surface 1007 of the housing 1004 may be provided with a connection terminal for connecting the portable information terminal in FIG. 23B to an external device and/or a button used to operate the portable information terminal.

The display portion 1002b and the display portion 1005 may display different images or one image. Note that the display portion 1005 is not necessarily provided, and a keyboard which is an input device may be provided instead of the display portion 1005.

The portable information terminal illustrated in FIG. 23B includes a CPU, a memory circuit, and an interface for transmitting and receiving signals between the external device and each of the CPU and the memory circuit, in the housing 1001b or the housing 1004. Note that the portable information terminal in FIG. 23B may be further provided with an antenna which transmits and receives signals to/from the external device.

The portable information terminal illustrated in FIG. 23B has a function of one or more of a telephone set, an electronic book, a personal computer, and a game machine.

The electronic device in FIG. 23C is an example of a stationary information terminal. The stationary information terminal illustrated in FIG. 23C includes a housing 1001c and a display portion 1002c provided in the housing 1001c.

Note that the display portion 1002c may be provided on a deck portion 1008 of the housing 1001c.

The stationary information terminal illustrated in FIG. 23C includes a CPU, a memory circuit, and an interface for transmitting and receiving signals between the external device and each of the CPU and the memory circuit, in the housing 1001c. Note that the stationary information terminal in FIG. 23C may be further provided with an antenna which transmits and receives signals to/from the external device.

Further, a side surface 1003c of the housing 1001c in the stationary information terminal in FIG. 23C may be provided with one or more parts selected from a ticket ejection portion that ejects a ticket or the like, a coin slot, and a bill slot.

The stationary information terminal in FIG. 23C serves, for examples, as an automated teller machine, an information communication terminal for ticketing or the like (also referred to as a multi-media station), or a game machine.

Figure 23D:
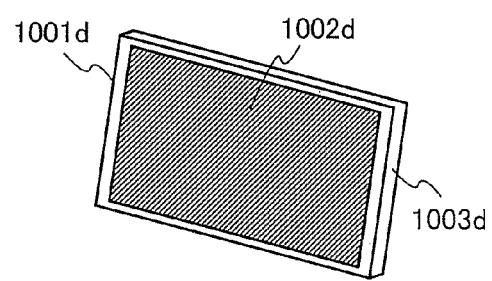

FIG. 23D illustrates an example of a stationary information terminal. The stationary information terminal in FIG. 23D includes a housing 1001d and a display portion 1002d provided in the housing 1001d. Note that a support for supporting the housing 1001d may also be provided.

Note that a side surface 1003d of the housing 1001d may be provided with a connection terminal for connecting the stationary information terminal in FIG. 23D to an external device and/or a button used to operate the stationary information terminal.

The stationary information terminal illustrated in FIG. 23D includes a CPU, a memory circuit, and an interface for transmitting and receiving signals between the external device and each of the CPU and the memory circuit, in the housing 1001d. Note that the stationary information terminal illustrated in FIG. 23D may be provided with an antenna which transmits and receives signals to/from the external device.

The stationary information terminal in FIG. 23D serves, for example, as a digital photo frame, a monitor, or a television set.

The logic circuit according to the above embodiment is used as each of the CPUs in the electronic devices illustrated in FIGS. 23A to 23D.

As described with reference to FIGS. 23A to 23D, the examples of the electronic devices according to this embodiment each include the logic circuit according to the above embodiment as the CPU.

This application is based on Japanese Patent Application serial no. 2011-113734 filed with the Japan Patent Office on May 20, 2011, the entire contents of which are hereby incorporated by reference.

What is claimed is:

1. A semiconductor device comprising:
   a first capacitor;
   a second capacitor;
   a first transistor; and
   a second transistor,
   wherein one electrode of the first capacitor and one electrode of the second capacitor are electrically connected to each other,
   wherein the one electrode of the first capacitor is electrically connected to a gate electrode of the second transistor,
   wherein the one electrode of the second capacitor is electrically connected to one of a source electrode and a drain electrode of the first transistor, and
   wherein a channel formation region of the first transistor comprises an oxide semiconductor.

2. The semiconductor device according to claim 1, wherein the second transistor is an n-type channel transistor.

3. The semiconductor device according to claim 1, wherein the second transistor is a p-type channel transistor.

4. The semiconductor device according to claim 1,
wherein a node electrically connected to the gate electrode of the second transistor has electric charge,
wherein a first signal is input to the gate electrode of the second transistor through the first capacitor,
wherein a second signal is input to the gate electrode of the second transistor through the second capacitor, and
wherein the electric charge, the first signal and the second signal are configured to control a switching function of the second transistor.

5. The semiconductor device according to claim 1, wherein the semiconductor device is configured to be dynamically reconfigured.

6. The semiconductor device according to claim 1, wherein the oxide semiconductor comprises indium and zinc.

7. A semiconductor device comprising:
a first capacitor;
a second capacitor;
a first transistor;
a second transistor;
a third transistor;
a fourth transistor; and
an inverter,
wherein one electrode of the first capacitor and one electrode of the second capacitor are electrically connected to each other,
wherein the one electrode of the first capacitor is electrically connected to a gate electrode of the second transistor,
wherein the one electrode of the second capacitor is electrically connected to one of a source electrode and a drain electrode of the first transistor,
wherein one of a source electrode and a drain electrode of the second transistor is electrically connected to one of a source electrode and a drain electrode of the third transistor, and
wherein the other of the source electrode and the drain electrode of the third transistor is electrically connected to one of a source electrode and a drain electrode of the fourth transistor and the inverter.

8. The semiconductor device according to claim 7, wherein the first transistor comprises an oxide semiconductor.

9. The semiconductor device according to claim 7, wherein at least one of the third transistor and the fourth transistor comprises an oxide semiconductor.

10. The semiconductor device according to claim 7, wherein the second transistor is an n-type channel transistor.

11. The semiconductor device according to claim 7, wherein the second transistor is a p-type channel transistor.

12. The semiconductor device according to claim 7,
wherein a node electrically connected to the gate electrode of the second transistor has electric charge,
wherein a first signal is input to the gate electrode of the second transistor through the first capacitor,
wherein a second signal is input to the gate electrode of the second transistor through the second capacitor, and
wherein the electric charge, the first signal and the second signal are configured to control a switching function of the second transistor.

13. The semiconductor device according to claim 12,
wherein a logical operation is output from the inverter,
wherein the logical operation is a logical conjunction when the electric charge is in a first condition, and
wherein the logical operation is a logical disjunction when the electric charge is in a second condition.

14. The semiconductor device according to claim 13,
wherein the first signal and the second signal are high potentials in the first condition, and
wherein the first signal and the second signal are low potentials in the second condition.

15. The semiconductor device according to claim 7,
wherein the other of the source electrode and the drain electrode of the second transistor is electrically connected to a high potential power source, and
wherein the other of the source electrode and the drain electrode of the fourth transistor is electrically connected to a low potential power source.

16. The semiconductor device according to claim 7, wherein the semiconductor device is configured to be dynamically reconfigured.

17. A method for driving a semiconductor device, the semiconductor device comprising a first capacitor, a second capacitor, a first transistor; and a second transistor,
wherein one electrode of the first capacitor and one electrode of the second capacitor are electrically connected to each other,
wherein the one electrode of the first capacitor is electrically connected to a gate electrode of the second transistor, and
wherein the one electrode of the second capacitor is electrically connected to one of a source electrode and a drain electrode of the first transistor,
the method comprising the steps of:
turning on the first transistor;
turning off the first transistor to hold electric charge of a node electrically connected to the gate electrode of the second transistor;
supplying a first signal to the gate electrode of the second transistor through the first capacitor;
supplying a second signal to the gate electrode of the second transistor through the second capacitor; and
controlling a switching function of the second transistor by the electric charge, the first signal and the second signal.

18. The method for driving a semiconductor device according to claim 17, wherein the first transistor comprises an oxide semiconductor.

19. The method for driving a semiconductor device according to claim 17, wherein the second transistor is an n-type channel transistor.

20. The method for driving a semiconductor device according to claim 17, wherein the second transistor is a p-type channel transistor.

21. The method for driving a semiconductor device according to claim 17, wherein the semiconductor device is configured to be dynamically reconfigured.

22. A method for driving a semiconductor device, the semiconductor device comprising a first capacitor, a second capacitor, a first transistor; a second transistor, a third transistor, a fourth transistor and an inverter,
wherein one electrode of the first capacitor and one electrode of the second capacitor are electrically connected to each other,
wherein the one electrode of the first capacitor is electrically connected to a gate electrode of the second transistor,
wherein the one electrode of the second capacitor is electrically connected to one of a source electrode and a drain electrode of the first transistor,
wherein one of a source electrode and a drain electrode of the second transistor is electrically connected to one of a source electrode and a drain electrode of the third transistor, and wherein the other of the source electrode and the drain electrode of the third transistor is electrically connected to one of a source electrode and a drain electrode of the fourth transistor and the inverter, the method comprising the steps of:

turning on the first transistor;

turning off the first transistor to hold electric charge of a node electrically connected to the gate electrode of the second transistor;

supplying a first signal to the gate electrode of the second transistor through the first capacitor;

supplying a second signal to the gate electrode of the second transistor through the second capacitor;

controlling a switching function of the second transistor by the electric charge, the first signal and the second signal; and outputting a logical operation from the inverter.

23. The method for driving a semiconductor device according to claim 22, wherein the first transistor comprises an oxide semiconductor.

24. The method for driving a semiconductor device according to claim 22, wherein at least one of the third transistor and the fourth transistor comprises an oxide semiconductor.

25. The method for driving a semiconductor device according to claim 22, wherein the second transistor is an n-type channel transistor.

26. The method for driving a semiconductor device according to claim 22, wherein the second transistor is a p-type channel transistor.

27. The method for driving a semiconductor device according to claim 22, wherein the semiconductor device is configured to be dynamically reconfigured.

28. The method for driving a semiconductor device according to claim 22, wherein the other of the source electrode and the drain electrode of the second transistor is electrically connected to a high potential power source, and wherein the other of the source electrode and the drain electrode of the fourth transistor is electrically connected to a low potential power source.

29. The method for driving a semiconductor device according to claim 22, wherein the logical operation is a logical conjunction when the electric charge is in a first condition, and wherein the logical operation is a logical disjunction when the electric charge is in a second condition.

30. The method for driving a semiconductor device according to claim 29, wherein the first signal and the second signal are high potentials in the first condition, and wherein the first signal and the second signal are low potentials in the second condition.

* * * * *

UNITED STATES PATENT AND TRADEMARK OFFICE
CERTIFICATE OF CORRECTION

PATENT NO.         : 8,542,034 B2
APPLICATION NO.    : 13/472979
DATED              : September 24, 2013
INVENTOR(S)        : Kiyoshi Kato It is certified that error appears in the above-identified patent and that said Letters Patent is hereby corrected as shown below:

In the Drawings:

FIG. 17A, Y-axis; Change "$^1$E-03" to --1E-03--.
FIG. 17A, Y-axis; Change "E-04" to --1E-04--. As shown in the Fig. Below.

FIG. 17A, Y-axis; Change

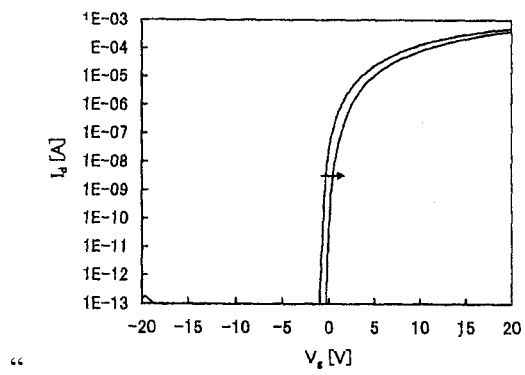

" to --

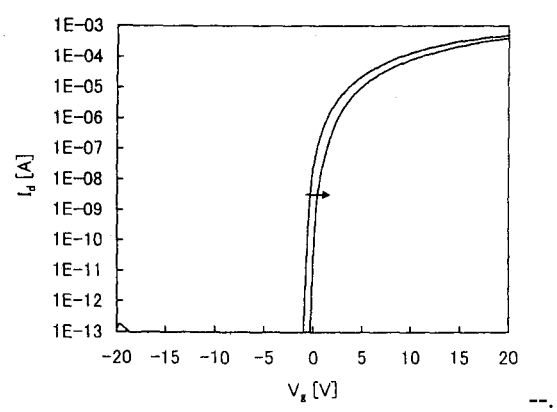

--.

In the Specification:

Column 21, line 48; Change "metal (Ga or in) atom" to --metal (Ga or In) atom--.
Column 23, line 53; Change "605a b," to --605a_b,--.
Column 30, line 33; Change "100 cm$^3$/V•s." to --100 cm$^2$/V•s.--.

Signed and Sealed this
Seventeenth Day of December, 2013

Margaret A. Focarino
*Commissioner for Patents of the United States Patent and Trademark Office*